US011418894B2

(12) United States Patent
Woodruff et al.

(10) Patent No.: US 11,418,894 B2
(45) Date of Patent: Aug. 16, 2022

(54) MEDIA SYSTEM AND METHOD OF AMPLIFYING AUDIO SIGNAL USING AUDIO FILTER CORRESPONDING TO HEARING LOSS PROFILE

(71) Applicant: Apple Inc., Cupertino, CA (US)

(72) Inventors: John Woodruff, Santa Cruz, CA (US); Yacine Azmi, San Mateo, CA (US); Ian M. Fisch, Vacaville, CA (US); Jing Xia, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/872,068

(22) Filed: May 11, 2020

(65) Prior Publication Data

US 2020/0382883 A1 Dec. 3, 2020

Related U.S. Application Data

(60) Provisional application No. 62/855,951, filed on Jun. 1, 2019.

(51) Int. Cl.
*H03G 7/00* (2006.01)
*H04R 25/00* (2006.01)

(52) U.S. Cl.
CPC .......... *H04R 25/505* (2013.01); *H04R 25/70* (2013.01); *H04R 2205/041* (2013.01); *H04R 2225/43* (2013.01)

(58) Field of Classification Search
CPC .................. H04R 25/70; H04R 25/505; H04R 2205/041; H04R 2225/43

(Continued)

(56) References Cited

U.S. PATENT DOCUMENTS

| | | |
|---|---|---|
| 4,548,082 A | 10/1985 | Engebretson et al. |
| 5,303,327 A | 4/1994 | Sturner et al. |

(Continued)

FOREIGN PATENT DOCUMENTS

| | | |
|---|---|---|
| CN | 108024178 A | 5/2018 |
| CN | 109788420 A | 5/2019 |

(Continued)

OTHER PUBLICATIONS

Office Action for Australia Application No. 22020203568 dated Nov. 30, 2020, 6 pp.

(Continued)

*Primary Examiner* — Katherine A Faley
(74) *Attorney, Agent, or Firm* — Womble Bond Dickinson (US) LLP

(57) ABSTRACT

A media system and a method of using the media system to accommodate hearing loss of a user, are described. The method includes selecting a personal level-and-frequency dependent audio filter that corresponds to a hearing loss profile of the user. The personal level-and-frequency dependent audio filter can be one of several level-and-frequency-dependent audio filters having respective average gain levels and respective gain contours. An accommodative audio output signal can be generated by applying the personal level-and-frequency dependent audio filter to an audio input signal to enhance the audio input signal based on an input level and an input frequency of the audio input signal. The audio output signal can be played by an audio output device to deliver speech or music that the user perceives clearly, despite the hearing loss of the user. Other aspects are also described and claimed.

20 Claims, 17 Drawing Sheets

(58) Field of Classification Search
USPC .................................................. 381/106, 321
See application file for complete search history.

(56) References Cited

U.S. PATENT DOCUMENTS

| | | | | |
|---|---|---|---|---|
| 2008/0165980 | A1 | 7/2008 | Pavlovic et al. | |
| 2009/0274310 | A1 | 11/2009 | Taenser | |
| 2014/0194775 | A1 | 7/2014 | Van Hasselt et al. | |
| 2014/0198027 | A1 | 7/2014 | Edelstein | |
| 2014/0254842 | A1 | 9/2014 | Smith et al. | |
| 2016/0142538 | A1 | 5/2016 | Bredikhin et al. | |
| 2019/0149921 | A1 | 5/2019 | Pedersen et al. | |
| 2019/0356989 | A1 * | 11/2019 | Li ............................ | A61B 3/02 |

FOREIGN PATENT DOCUMENTS

| | | | |
|---|---|---|---|
| EP | 3276983 | A1 | 1/2018 |
| KR | 20180087782 | A | 8/2018 |
| TW | 201815173 | A | 4/2018 |
| WO | 2004004414 | A1 | 8/2004 |
| WO | 2008086112 | A1 | 7/2008 |

OTHER PUBLICATIONS

Chinese Office Action from related Chinese Patent Application No. 202010482726.9 dated May 27, 2021 (18 pages including translation).

Korean Office Action from related Korean Patent Application No. 10-2020-0064781 dated Aug. 18, 2021 (20 pages including translation).

Australian Examination report No. 1 from related Australian Patent Application No. 2021204971 dated Apr. 26, 2022 (6 pages).

* cited by examiner

MEDIA SYSTEM AND METHOD OF AMPLIFYING AUDIO SIGNAL USING AUDIO FILTER CORRESPONDING TO HEARING LOSS PROFILE

This application claims the benefit of priority of U.S. Provisional Patent Application No. 62/855,951 filed Jun. 1, 2019, and incorporates herein by reference that provisional patent application.

BACKGROUND

Field

Aspects related to media systems having audio capabilities are disclosed. More particularly, aspects related to media systems used to play audio content to a user are disclosed.

Background Information

Audio-capable devices, such as laptop computers, tablet computers, or other mobile devices, can deliver audio content to a user. For example, the user may use the audio-capable device to listen to audio content. The audio content can be pre-stored audio content, such as a music file, a podcast, a virtual assistant message, etc., which is played to the user by a speaker. Alternatively, the reproduced audio content can be real-time audio content, such as audio content from a phone call, a videoconference, etc.

Noise exposure, ageing, or other factors can cause an individual to experience hearing loss. Hearing loss profiles of individuals can vary widely, and may even be attributed to people that are not diagnosed as having hearing impairment. That is, every individual can have some frequency-dependent loudness perceptions that differ from a norm. Such differences can vary widely across a human population, and correspond to a spectrum of hearing loss profiles of the human population. Given that each individual hears differently, audio content that is reproduced in the same way to several individuals may be experienced differently by each. For example, a person with substantial hearing loss at a particular frequency may experience playback of audio content containing substantial components at that frequency as being muffled. By contrast a person without hearing loss at the particular frequency may experience playback of the same audio content as being clear.

An individual can adjust audio-capable devices to modify playback of audio content in order to enhance the user's experience. For example, the person that has substantial hearing loss at the particular frequency can adjust an overall level of the audio signal volume to increase a loudness of the reproduced audio. Such adjustments can be made in hopes that the modified playback will compensate for the hearing loss of the person.

SUMMARY

Volume adjustment to modify playback as described above can fail to compensate for hearing loss in a personalized manner. For example, increasing an overall level of the audio signal can increase loudness, however, the loudness is increased across a range of audible frequencies regardless of whether the user experiences hearing loss across the entire range. The result of such broad-scale level adjustments can be an uncomfortably loud and disturbing listening experience for the user.

A media system and a method of using the media system to accommodate hearing loss of a user, are described. In an aspect, the media system performs the method by selecting an audio filter, e.g., a level-and-frequency-dependent audio filter, from several audio filters, e.g., several level-and-frequency-dependent audio filters, and applying the audio filter to an audio input signal to generate an audio output signal that can be played back to a user. The audio filter can be a personal audio filter, e.g., a personal level-and-frequency dependent audio filter that corresponds to a hearing loss profile of the user.

The selection of the personal level-and-frequency dependent audio filter can be made by the media system from level-and-frequency-dependent audio filters that correspond to respective preset hearing loss profiles. The level-and-frequency-dependent audio filters compensate for the preset hearing loss profiles because the level-and-frequency-dependent audio filters have respective average gain levels and respective gain contours that correspond to average loss levels and loss contours of the hearing loss profiles. The personal level-and-frequency dependent audio filter can amplify the audio input signal based on an input level and an input frequency of the audio input signal, and thus, the user can experience sound from the reproduced audio output signal normally (rather than muffled as would be the case if the uncorrected audio input signal were played).

Selection of the personal level-and-frequency dependent audio filter can be made through a brief and straightforward enrollment process. In an aspect, a first audio signal is output during a first stage of the enrollment process using one or more predetermined gain levels or using a first group of level-and-frequency-dependent audio filters having different average gain levels. The first audio signal can be played back to a user that experiences the audio content, e.g., speech, at different loudnesses. The user can select the loudness that is audible or preferable. More particularly, the media system receives, in response to outputting the first audio signal using the one or more predetermined gain levels or the one or more level-and-frequency-dependent audio filters of the first group, a selection of a personal average gain level. The selection of the personal average train level can indicate that the first audio signal, e.g., a speech signal, is output at a level that is audible to the user. The selection of the personal average gain level can indicate that the first audio signal is output at a preferred loudness. The media system can select the personal level-and-frequency-dependent audio filter based in part on the personal level-and-frequency-dependent audio filter having the personal average gain level. For example, the respective average gain level of the personal level-and-frequency-dependent audio filter can be equal to the personal average gain level.

In an aspect, a second audio signal is output during a second stage of the enrollment process using a second group of level-and-frequency-dependent audio filters having different gain contours. The second group of level-and-frequency-dependent audio filters may be selected for exploration based on the user selection made during the first stage of the enrollment process. For example, each level-and-frequency-dependent audio filter in the second group can have the personal average gain level corresponding to the audibility selection made during the first stage. The second audio signal can be played back to the user that experiences the audio content, e.g., music, at different timbre or tonal settings and selects the timbre or tonal setting that is preferable. More particularly, the media system receives, in response to outputting the second audio signal, a selection of a personal gain contour. The media system can select the personal level-and-frequency-dependent audio filter based in part on the personal level-and-frequency-dependent audio filter having the personal gain contour. For example, the respective gain contour of the personal level-and-frequency-dependent audio filter can be equal to the personal gain contour.

In an aspect, the enrollment process can modify the first and second audio signals for play back using level-and-frequency-dependent audio filters that correspond to preset hearing loss profiles. For example, audio filters corresponding to the most common hearing loss profiles in a human population can be used. The audio filters can alternatively correspond to hearing loss profiles from the human population that relate closely to an audiogram of the user. For example, the media system can receive a personal audiogram of the user, and based on the personal audiogram, several preset hearing loss profiles can be determined that encompass the hearing loss profile of the user as represented by the audiogram. The media system can then determine the level-and-frequency-dependent audio filters that correspond to the determined hearing loss profiles, and use those audio filters during the presentation of audio in the first stage or the second stage of the enrollment process.

The media system may select the personal level-and-frequency dependent audio filter based directly on an audiogram of the user without utilizing the enrollment process. For example, the media system can receive a personal audiogram of the user, and based on the personal audiogram, a preset personal hearing loss profile can be selected that most closely matches the hearing loss profile of the user as represented by the audiogram. For example, the personal audiogram may indicate that the user has an average hearing loss level and a loss contour, and the media system can select a preset hearing loss profile that fits the audiogram. The media system can then determine the level-and-frequency-dependent audio filter that corresponds to the personal hearing loss profile. For example, the media system can determine the level-and-frequency-dependent audio filter having an average gain level corresponding to the average hearing loss level of the audiogram and/or having a gain contour corresponding to the loss contour. The media system can use the audio filter as the personal level-and-frequency dependent audio filter to enhance the audio input signal and compensate for the hearing loss of the user when playing back audio content.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

DETAILED DESCRIPTION

Figure 1:
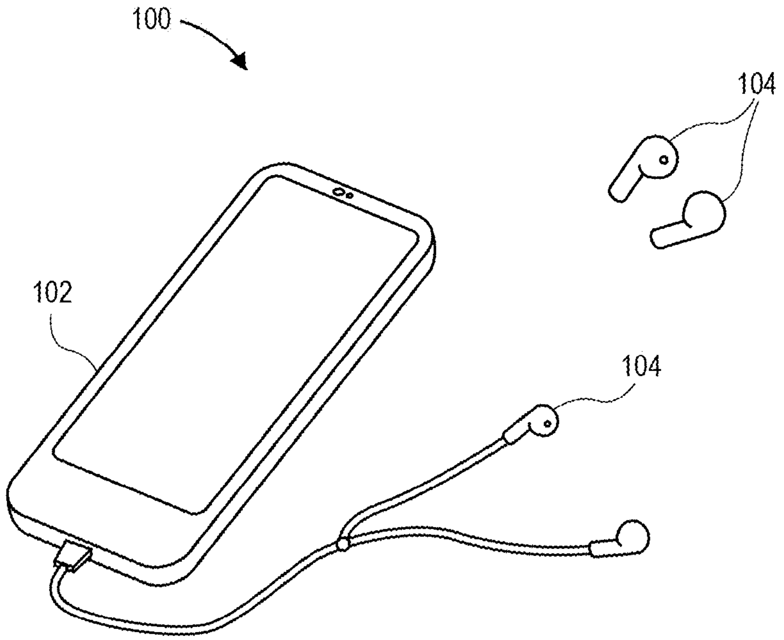
FIG. 1 is a pictorial view of a media system, in accordance with an aspect.

Aspects describe a media system and a method of using the media system to accommodate hearing loss of a user. The media system can include a mobile device, such as a smartphone, and an audio output device, such as an earphone. The mobile device, however, can be another device for rendering audio to the user, such as a desktop computer, a laptop computer, a tablet computer, a smartwatch, etc., and the audio output device can include other types of devices, such as headphones, a headset, a computer speaker, etc., to name only a few possible applications.

In various aspects, description is made with reference to the figures. However, certain aspects may be practiced without one or more of these specific details, or in combination with other known methods and configurations. In the following description, numerous specific details are set forth, such as specific configurations, dimensions, and processes, in order to provide a thorough understanding of the aspects. In other instances, well-known processes and manufacturing techniques have not been described in particular detail in order to not unnecessarily obscure the description. Reference throughout this specification to "one aspect," "an aspect," or the like, means that a particular feature, structure, configuration, or characteristic described is included in at least one aspect. Thus, the appearance of the phrase "one aspect," "an aspect," or the like, in various places throughout this specification are not necessarily referring to the same aspect. Furthermore, the particular features, structures, configurations, or characteristics may be combined in any suitable manner in one or more aspects.

The use of relative terms throughout the description may denote a relative position or direction. For example, "in front of" may indicate a first direction away from a reference point. Similarly, "behind" may indicate a location in a second direction away from the reference point and opposite to the first direction. Such terms are provided to establish relative frames of reference, however, and are not intended to limit the use or orientation of a media system to a specific configuration described in the various aspects below.

In an aspect, a media system is used to accommodate hearing loss of a user. The media system can compensate for a hearing loss profile, whether mild or moderate, of the user. Furthermore, the compensation can be personalized, meaning that it adjusts an audio input signal in a level-dependent and frequency-dependent manner based on the unique hearing preferences of the individual, rather than adjusting only a balance or an overall level of the audio input signal. The media system can personalize the audio tuning based on selections made during a brief and straightforward enrollment process. During the enrollment process the user can experience sounds from several audio signals filtered in different manners, and the user can make binary choices based on subjective evaluations or comparisons of the experiences to select personal audio settings. The personal audio settings include an average gain level and a gain contour of a preferred audio filter. When the user has selected the personal audio settings, the media system can generate an audio output signal by applying a personal level-and-frequency dependent audio filter having the personal audio settings to amplify an audio input signal based on an input level and an input frequency of the audio input signal. Playback of the audio output signal can deliver speech or music to the user that is clear to the user despite the user's hearing loss profile.

Referring to FIG. 1, a pictorial view of a media system is shown in accordance with an aspect. A media system 100 can be used to deliver audio to a user. Media system 100 can include an audio signal device 102 to output and/or transmit an audio output signal, and an audio output device 104 to convert the audio output signal (or a signal derived from the audio output signal) into a sound. In an aspect, audio signal device 102 is a smartphone. Audio signal device 102 may, however, include other types of audio-capable devices such as a laptop computer, a tablet computer, a smartwatch, a television, etc. In an aspect, audio output device 104 is an earphone (corded or wireless). Audio output device 104 may, however, include other types of devices containing audio speakers such as headphones. Audio output device 104 can also be an internal or external speaker of the audio signal device 102, e.g., a speaker of a smartphone, a laptop computer, a tablet computer, a smartwatch, a television, etc. In any case, media system 100 can include hardware such as one or more processors, memory, etc., which enable the media system 100 to perform a method of enhancing an audio input signal to accommodate hearing loss of a user. More particularly, the media system 100 can provide personalized media enhancement by applying a personalized audio filter of the user to the audio input signal to enable playback of audio content that accommodates the hearing preferences and or hearing abilities of the user.

Figure 2:
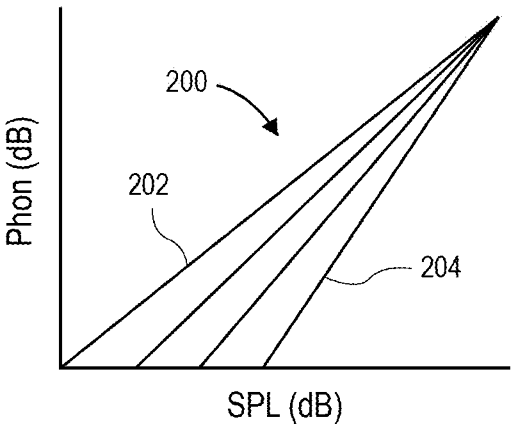
FIG. 2 is a graph of loudness curves for individuals having sensorineural hearing loss, in accordance with an aspect.

Referring to FIG. 2, a graph of loudness curves for individuals having sensorineural hearing loss is shown in accordance with an aspect. Sensorineural hearing loss is a predominant type of hearing loss, however, other types of hearing loss, such as conductive hearing loss, exist. Individuals having sensorineural hearing loss have higher audibility thresholds than normal listeners but similarly experience loud levels as uncomfortable. Loudness curves for individuals with conductive hearing loss would differ. More particularly, individuals having conductive hearing loss have higher audibility thresholds and uncomfortably loud levels as compared to their counterparts having normal hearing. Loudness level curves 200 are used by way of example.

The hearing preferences and/or hearing abilities of a user are frequency-dependent and level-dependent. Individuals that have hearing impairment require a higher sound pressure level in their ears to reach a same perceived loudness as individuals that have less hearing loss. The graph shows loudness level curves 200, which describe perceived loudness (PHON) as a function of sound pressure level (SPL) for several individuals at a particular frequency, e.g., 1 kHz. Curve 202 has a 1:1 slope and an origin at zero because a loudness unit, e.g., 50 PHON, is defined as the perceived loudness of a 1 kHz tone of the corresponding SPL, e.g., 50 dB SPL, by a normal hearing listener. By contrast, an individual having impaired hearing 204 has no perceived loudness until the sound pressure level reaches a threshold level. For example, when the individual has 60 dB hearing loss, the individual will not perceive loudness until the sound pressure level reaches 60 dB.

Figure 3:
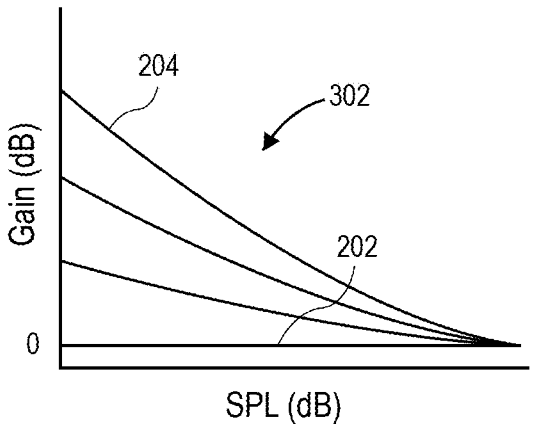
FIG. 3 is a graph of amplifications required to normalize perceived loudness by individuals having different hearing loss profiles, in accordance with an aspect.

Referring to FIG. 3, a graph of amplifications required to normalize perceived loudness by individuals having different hearing loss profiles is shown in accordance with an aspect. To compensate for hearing loss of an individual, a gain can be applied to an input signal to raise the sound pressure level in the ear of the individual that has hearing loss. The graph shows gain curves 302, which describe the gain required to match normal hearing loudness as a function of sound pressure level for the individuals having the loudness level curves of FIG. 2. It is evident that, at a particular frequency, the individual having normal hearing 202 requires no amplification because, obviously, the individual already has normal hearing loudness at all sound pressure levels. By contrast, the individual having impaired hearing 204 requires substantial amplification at low sound pressure levels in order to perceive the applied sound below the threshold level of FIG. 2, e.g., below 60 dB.

The amount of amplification required to compensate for the hearing loss of the individual decreases as sound pressure level increases. More particularly, the amount of amplification required to compensate for the hearing loss depends on both frequency and input signal level. That is, when the input signal level of the audio input signal produces a higher sound pressure level for a given frequency, less amplification is required to compensate for the hearing loss at the frequency. Similarly, hearing loss of individuals is frequency-dependent, and thus, the loudness level curves and gain curves may differ at another frequency, e.g., 2 kHz. By way of example, if the gain curves shift upward for the individual having impaired hearing (more hearing loss at 2 kHz than 1 kHz), more amplification is required to perceive sound normally at that frequency. Accordingly, when the input signal level of the audio input signal has components at the particularly frequency (2 kHz), more amplification is required to compensate for the hearing loss at the frequency. The method of adjusting the audio input signal to amplify the audio input signal based on an input level and an input frequency of the audio input signal may be referred to herein as multiband upward compression.

Multiband upward compression can achieve the desired enhancement of audio content by bringing sounds that are either not perceived or perceived as being too quiet into an audible range, without adjusting sounds that are already perceived as being adequately or normally loud. In other words, multiband upward compression can boost the audio input signal in a level-dependent and frequency-dependent manner to cause a hearing impaired individual to perceive sounds normally. The normalization of the loudness level curve of the hearing impaired individual can avoid over- or under-amplification at certain levels or frequencies, which avoids problems associated with simply turning up volume and amplifying the audio input signal across an entire audible frequency range.

Figure 4:
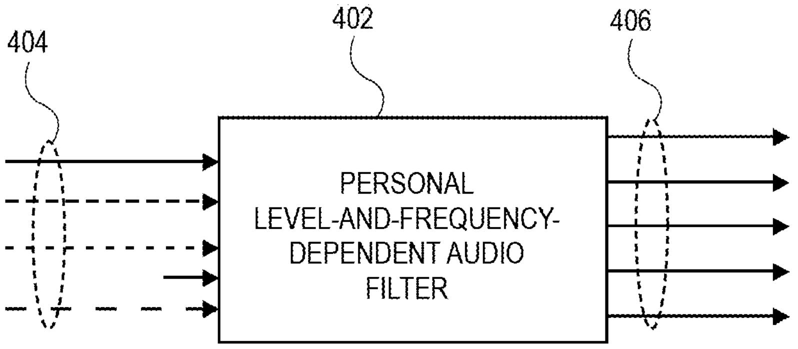
FIG. 4 is a pictorial view of a personal level-and-frequency dependent audio filter applied to an audio input signal to accommodate hearing loss of a user, in accordance with an aspect.

Referring to FIG. 4, a pictorial view of a personal level-and-frequency dependent audio filter applied to an audio input signal to accommodate hearing loss of a user is shown in accordance with an aspect. In light of the above discussion, it will be appreciated that the media system 100 can accommodate the hearing loss of an individual by applying a personal level-and-frequency dependent audio filter 402 to an audio input signal 404. Personal level-and-frequency dependent audio filter 402 can transform the audio input signal 404 into audio output signal 406 that will be normally perceived by the individual. By way of example, audio input signal 404 may represent speech in a phone call, music in an audio track, voice from a virtual assistant, or other audio content. As indicated by the dashed and dotted leader lines, when reproduced without multiband upward compression, sound at certain frequencies may be perceived normally (indicated by a solid leader line) while sounds at other frequencies may be perceived quietly (dull or muffled) or not at all (indicated by dashed and dotted leader lines of varying density). By contrast, after applying personal level-and-frequency dependent audio filter 402 to audio input signal 404, the generated audio output signal 406 can contain sounds at the certain frequencies that are perceived normally (indicated by solid leader lines). Accordingly, personal level-and-frequency dependent audio filter 402 can restore detail in speech, music, and other audio content to enhance the sound that is played back to the user by audio output device 104.

Figure 5:
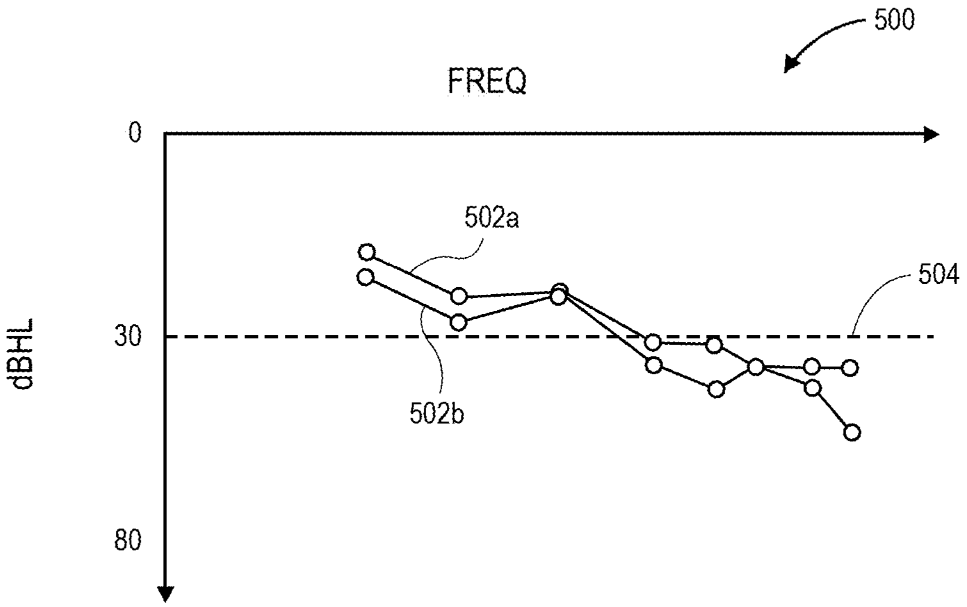
FIG. 5 is a pictorial view of an audiogram of a user, in accordance with an aspect.

Referring to FIG. 5, a pictorial view of an audiogram of a user is shown in accordance with an aspect. To understand how personal level-and-frequency dependent audio filter 402 can be selected or determined for use in enhancing audio input signal 404, it can be helpful to understand how a hearing loss profile of the user can be identified and mapped to a user-specific multiband compression filter. In an aspect, a personal audiogram 500 of the user can include one or more audiogram curves representing audible thresholds as a function of frequency. For example, a first audiogram curve 502*a* can represent audible thresholds for a right ear of the user, and a second audiogram curve 502*b* can represent audible thresholds for a left ear of the user. Personal audiogram 500 can be determined using known techniques. In an aspect, an average hearing loss 504 can be determined from one or both of the audiogram curves 502*a*, 502*b*. For example, average hearing loss 504 for both curves can be 30 dB in the illustrated example. Accordingly, personal audiogram 500 indicates both the average hearing loss of the user and the frequency-dependent hearing loss across a primary audible range of a human being, e.g., between 500 Hz to 8000 kHz. It will be noted that the primary audible range referred to herein may be less than an audible range of a human being, which is known to be 20 Hz to 20 kHz.

Figure 8:
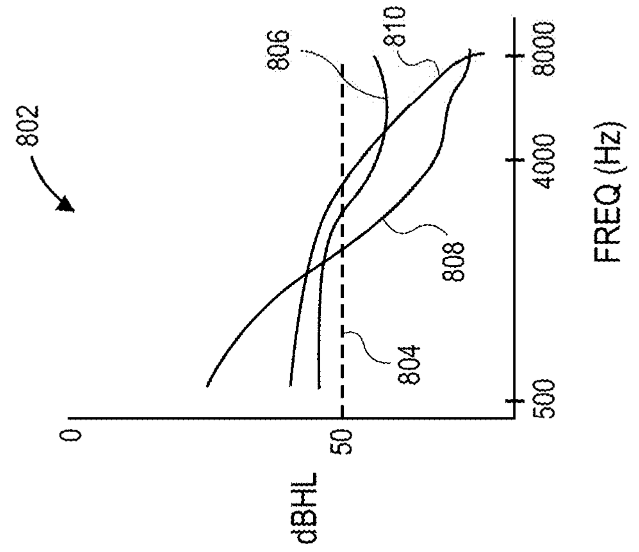
FIGS. 6-8 are pictorial views of hearing loss profiles, in accordance with an aspect.
Figure 7:
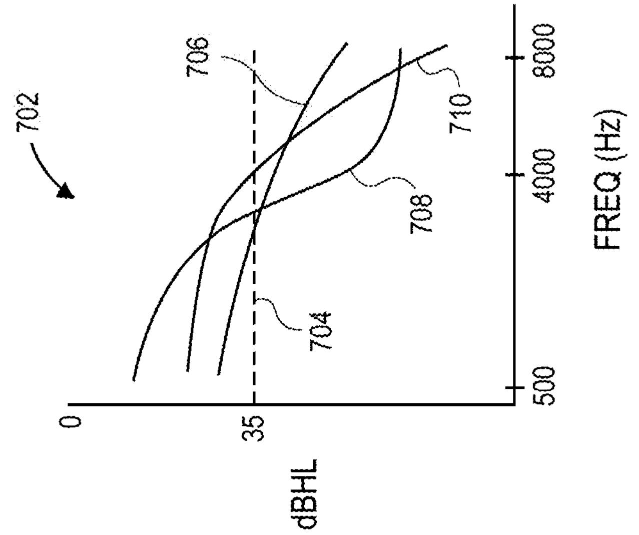
Figure 6:
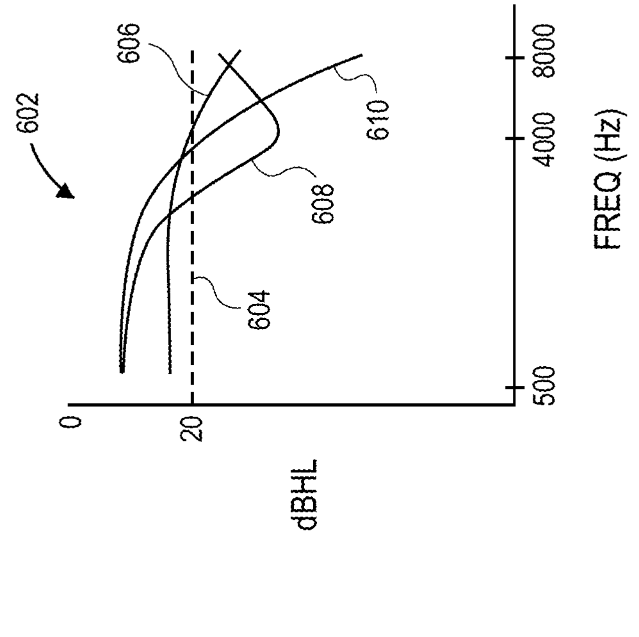

FIGS. 6-8 include pictorial views of hearing loss profiles of a human population. Each hearing loss profile, as described below, can have a combination of level and contour parameters. A level parameter of a hearing loss profile can indicate an average hearing loss as determined by pure tone audiometry. A contour parameter can indicate hearing loss variations over the audible frequency range, e.g., whether hearing loss is more pronounced at certain frequencies. The hearing loss profiles shown in FIGS. 6-8 can be grouped according to level and contour parameters. In an aspect, the hearing loss profiles are the most common profiles for hearing loss found in the human population based on an analysis of real audiograms. More particularly, each hearing loss profile can be representative of a common audiogram in a three-dimensional space of audiograms having unique level and contour parameters.

FIG. 6 shows a first group 602 of hearing loss profiles. Hearing loss profiles in the first group 602 can have a level parameter corresponding to listeners having mild hearing loss. For example, an average hearing loss 604 of first group 602 profiles can be 20 dB. More particularly, each of the hearing loss profiles contained within first group 602 can have a same average hearing loss 604. The hearing loss profiles, however, may differ in shape.

In an aspect, first group 602 can include hearing loss profiles having different contour parameters. The contour parameters can include a flat loss contour 606, a notched loss contour 608, and a sloped loss contour 610. The different shapes can have pronounced hearing loss at respective frequencies. For example, flat loss contour 606 can have more hearing loss at a low band frequency, e.g., at 500 Hz, than notched loss contour 608 or sloped loss contour 610. By contrast, notched loss contour 608 can have more hearing loss at an intermediate band frequency, e.g., at 4 kHz, than flat loss contour 606 or sloped loss contour 610. Sloped loss contour 610 can have more hearing loss at a high band frequency, e.g., at 8 kHz, than flat loss contour 606 or notched loss contour 608.

The hearing loss profile shapes can have other generalized distinctions. For example, flat loss contour 606 can have a smallest variation in hearing loss as compared to notched loss contour 608 and sloped loss contour 610. That is, flat loss contour 606 exhibits more consistent hearing loss at each frequency. Additionally, notched loss contour 608 can have more hearing loss at the intermediate band frequency than at other frequencies for the same curve.

FIG. 7 shows a pictorial view of a second group 702 of hearing loss profiles. Average hearing loss of each of the hearing loss profile groups can increase sequentially from FIGS. 6-8. More particularly, hearing loss profiles in second group 702 can have a level parameter corresponding to the listeners having mild to moderate hearing loss. For example, an average hearing loss 704 of second group 702 can be 35 dB. The hearing loss profiles of second group 702, however, can have different contour parameters, e.g., a flat loss contour 706, a notched loss contour 708, and a sloped loss contour 710. Due to regularities in hearing loss across the human population, the shapes of each level group can be related by shape. More particularly, the shapes of loss contours 706-710 can share the generalized distinctions described above with respect to loss contours 606-610, however, the shapes may not be identically scaled. For example, notched loss contour 708 can have a highest loss at the intermediate band frequency as compared to the other loss contours of FIG. 7, however, a maximum loss of notched loss contour 708 may be at a high band frequency (as compared to the intermediate band frequency in FIG. 6). Accordingly, the hearing loss profiles of FIG. 7 may represent the most common hearing loss profiles of people having mild to moderate hearing loss in the human population.

FIG. 8 shows a pictorial view of a third group 802 of hearing loss profiles. An average hearing loss 804 of third group 802 can be higher than average hearing loss 704 of second group 702. The average hearing loss of third group 802 can be representative of people having moderate hearing loss. For example, average hearing loss 804 can be 50 dB. Like the other groups, the hearing loss profiles of third group 802 can differ in shape and include a flat loss contour 806, a notched loss contour 808, and a sloped loss contour 810. The shapes of loss contours 806-810 can share the generalized distinctions described above with respect to loss contours 606-610 or 706-710. Accordingly, the hearing loss profiles of FIG. 8 may represent the most common hearing loss profiles of people having moderate hearing loss in the human population.

The hearing loss profiles shown in FIGS. 6-8 represent 9 presets for hearing loss profiles that are stored by media system 100. More particularly, media system 100 can store any number of hearing loss profile presets taken from the 3D space of audiograms described above. Each preset can have a level and contour parameter combination that can be compared to personal audiogram 500. One of the 9 presets of groups 602, 702, and 802 may be similar to personal audiogram 500. For example, by visual inspection, it is evident that personal audiogram 500 of FIG. 5 has an average hearing loss level closest to the hearing loss profiles of second group 702 (30 dB compared to 35 dB) and exhibits a shape closely related to flat loss contour 706. Accordingly, flat loss contour 706 can be identified as a personal hearing loss profile of the user that has personal audiogram 500.

The comparison between audiograms and hearing loss profiles as described above is introduced by way of example, and will be referenced again below with respect to FIGS. 21-22. At this stage, the example clarifies the concept that every individual can have actual hearing loss (as represented by an audiogram) that closely matches a common hearing loss profile (as determined from a human population and stored within media system 100 as a preset). To compensate for the actual hearing loss, media system 100 can apply personal level-and-frequency dependent audio filter 402 that corresponds to, and compensates for, the closely matching hearing loss profile.

Figure 9:
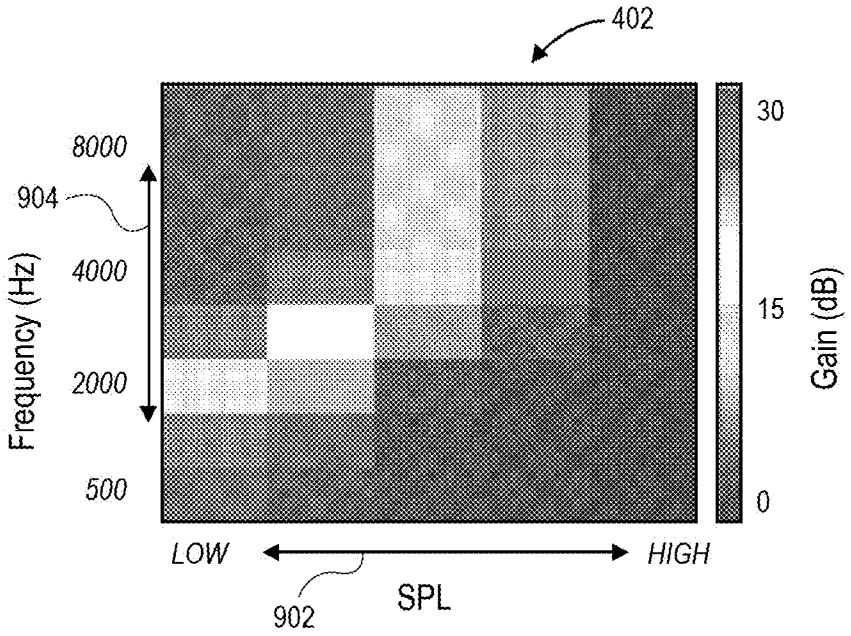
FIG. 9 is a pictorial view of a multiband compression gain table representing a level-and-frequency-dependent audio filter corresponding to a hearing loss profile, in accordance with an aspect.

Referring to FIG. 9, a pictorial view of a multiband compression gain table representing a level-and-frequency-dependent audio filter corresponding to a hearing loss profile is shown in accordance with an aspect. Each hearing loss profile can map to a respective level-and-frequency-dependent audio filter. For example, whichever hearing loss profile of groups 602-802 most closely match personal audiogram 500 can map to the level-and-frequency-dependent audio filter that is personal level-and-frequency dependent audio filter 402. Accordingly, media system 100 can store, e.g., in a memory, several preset hearing loss profiles and several level-and-frequency-dependent audio filters corresponding to the hearing loss profiles.

In an aspect, personal level-and-frequency dependent audio filter 402 can be a multiband compression gain table. The multiband compression gain table can be a user-specific prescription to compensate for the hearing loss of an individual and thereby provide personalized media enhancement. In an aspect, personal level-and-frequency dependent audio filter 402 is used to amplify audio input signal 404 based on an input level 902 and an input frequency 904. Input level 902 of audio input signal 404 can be determined within a range spanning from low sound pressure levels to high sound pressure levels. By way of example, audio input signal 404 can have the sound pressure level shown at the left of the gain table, which may be 20 dB, for example. Input frequency 904 of audio input signal 404 can be determined within an audible frequency range. By way of example, audio input signal 404 can have a frequency at the top of the gain table, which may be 8 kHz, for example. Based on input level 902 and input frequency 904 of audio input signal 404, media system 100 can determine that a particular gain level, e.g., 30 dB, is to be applied to audio input signal 404 to generate audio output signal 406. It will be appreciated that this example is consistent with the hearing loss and gain curves of FIGS. 2-3.

The gain table example of FIG. 9 illustrates that, for each hearing loss profile of a user, a corresponding level-and-frequency-dependent audio filter can be determined or selected to compensate for the hearing loss of the user. The level-and-frequency-dependent audio filters can define gain levels at each input frequency that inversely corresponds to hearing loss of an individual at the frequencies. By way of example, the user that has personal audiogram 500 matching flat loss contour 706 within second group 702 can have personal level-and-frequency dependent audio filter 402 that amplifies audio input signal 404 more at 8 kHz than at 500 Hz. the gain applied by the gain table across the audible frequency can nullify the hearing loss represented by the loss contour.

Figure 10:
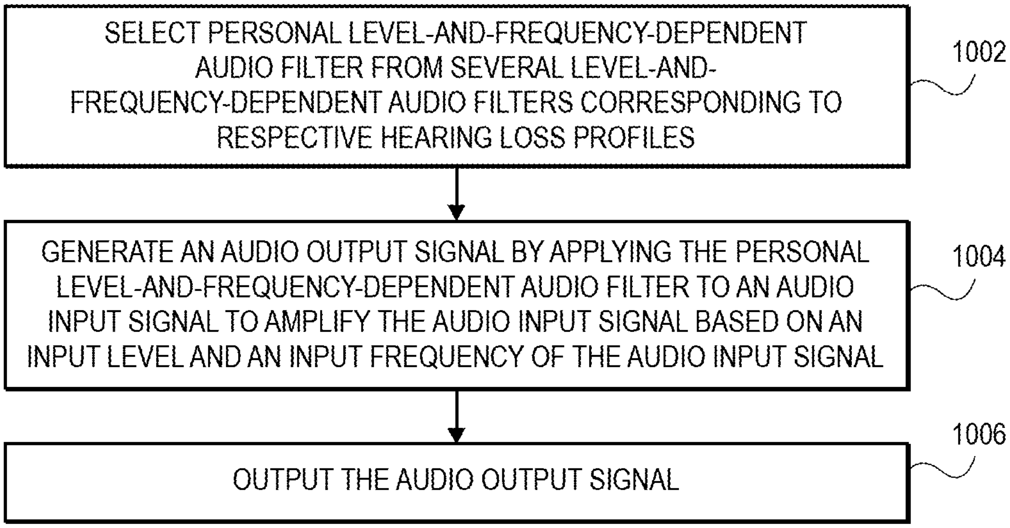
FIG. 10 is a flowchart of a method of enhancing an audio input signal to accommodate hearing loss, in accordance with an aspect.

Referring to FIG. 10, a flowchart of a method of enhancing an audio input signal to accommodate hearing loss is shown in accordance with an aspect. Media system 100 can perform the method to provide personalized enhancement of audio content. At operation 1002, one or more processors of media system 100 can select personal level-and-frequency dependent audio filter 402 from several level-and-frequency-dependent audio filters corresponding to respective hearing loss profiles. The selection process may be performed in various manners. For example, as mentioned above and discussed further below with respect to FIG. 22, the selection can include matching a personal audiogram of a user to a preset hearing loss profile. It is contemplated, however, that some users of media system 100 may not have an existing audiogram available for matching. Furthermore, even when such audiograms are available, there can be supra-threshold differences in loudness perceptions by different users. For example, two users that have similar audiograms may nonetheless subjectively experience sound pressure levels at a Liven frequency differently, e.g., a first user may be comfortable with the sound pressure level and a second user may find the sound pressure level uncomfortable. Thus, there may be benefit in personalizing the audio filter selection to the user rather than relying solely on the audiogram data. More particularly, the user may have preferences that are not fully captured by the audiogram data, and thus, there may be benefit in allowing the user to select from different level-and-frequency-dependent audio filters that did not necessarily match the personal audiogram precisely.

In an aspect, a convenient and noise-robust enrollment procedure can be used to drive the selection of a personal level-and-frequency dependent audio filter that accommodates the hearing preferences of the user. The enrollment procedure can play back one or more audio signals altered by one or more predetermined gain levels and/or one or more level-and-frequency-dependent audio filters that correspond to the most common hearing loss profiles of a predetermined demographic. The user can make selections during the enrollment procedures, e.g., of one or more of the level-and-frequency-dependent audio filters, and through the user selections, media system 100 can determine and/or select an appropriate personal level-and-frequency dependent audio filter to apply to an audio input signal for the user. Several embodiments of enrollment procedures are described below. The enrollment procedures can incorporate several stages, and one or more of the stages of the embodiments can differ. For example, FIGS. 11-15 describe an enrollment procedure that includes a first stage in which a selection by the user indicates whether a played back audio signal is audible, and FIGS. 16-20 describe an enrollment procedure that includes a first stage in which a selection by the user indicates a preferred audio filter from a group of audio filters having different average gain levels.

Figure 11:
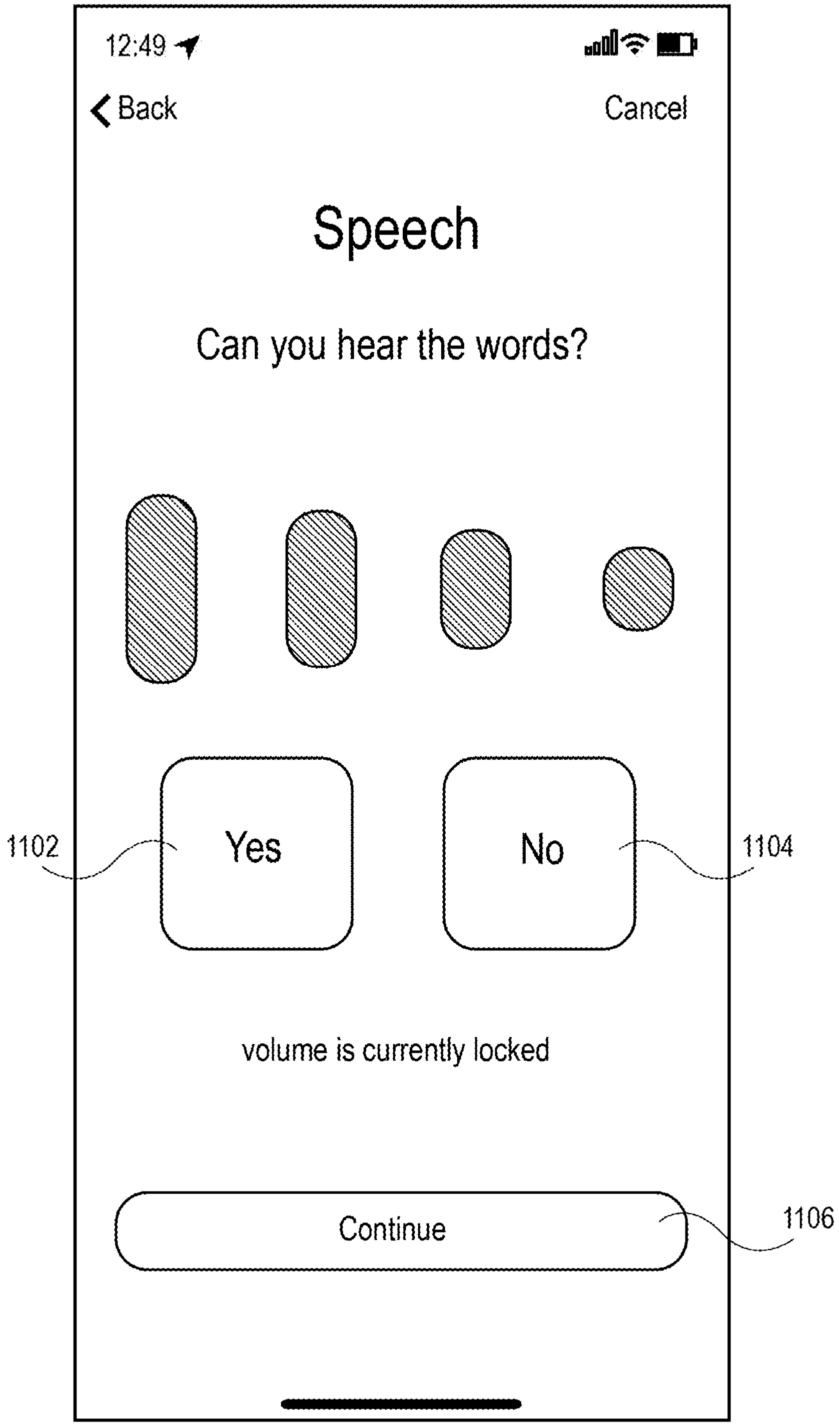
FIG. 11 is a pictorial view of a user interface to control output of a first audio signal, in accordance with an aspect.

Referring to FIG. 11, a pictorial view of a user interface to control output of a first audio signal is shown in accordance with an aspect. During the enrollment process, media system 100 can output a first audio signal using one or more predetermined gain levels. The predetermined gain levels can be scalar gain levels (wideband or frequency independent gains) that are applied to allow the audio signal to be played back at different loudnesses for listening by the user. For example, the media system can generate the first audio signal for playback by a speaker to the user. The first audio signal can represent speech, e.g., a speech file containing recorded greetings spoken in languages from around the world. Speech gives good contrast between gain levels (as compared to music), and thus, can facilitate the selection of an appropriate average gain level during a first stage of the enrollment process.

During the first stage, audio input signal 404 can be reproduced for the user with a first predetermined gain level. For example, the speech signal may be output at a low level, e.g., 40 dB or less. The first predetermined gain level can correspond to one of the different average hearing loss levels, e.g., levels 604, 704, or 804. For example, the 40 dB or less level may be expected to be heard by the demographic having average hearing loss level 604 and possibly not hearing loss levels 704 and 804.

During play back of the first audio signal at the first level of amplification, the user can select an audibility selection element 1102 or an inaudibility selection element 1104 of a graphical user interface displayed on audio signal device 102 of media system 100. More particularly, after listening to the first setting, the user can make a selection indicating whether the output audio signal has a loudness that is audible to the user. The user can select the audibility selection element 1102 to indicate that the output level is audible. By contrast, the user can select the inaudibility selection element 1104 to indicate that the output level is inaudible.

After making the selection of the audibility selection element 1102 or the inaudibility selection element 1104, the user may select the selection element 1106 to provide the selection to the system. When the system receives the selection of the audibility selection element 1102, the system can determine, based on the selection indicating whether the output audio signal is audible to the user, a personal average gain level of the user. For example, when the system receives the selection of the audibility selection element 1102 during a first phase of the first stage, the system can determine that the personal average gain level for the user corresponds to average hearing loss level 604 of the mild hearing loss profile group. This hearing loss profile group may be used as a basis for further exploration of level-and-frequency-dependent audio filters in a second stage of the enrollment procedure. By contrast, selection of the inaudibility selection element 1104 during the first phase can cause the enrollment procedure to progress to a second phase of the first stage of the enrollment procedure.

In the second phase of the first stage, the first audio signal may be played at a second level of amplification. For example, the speech signal may be output a higher level, e.g., 55 dB. After listening to the second setting, the user can select the audibility selection element 1102 or the inaudibility selection element 1104 to indicate whether the speech signal is audible.

After making the selection of the audibility selection element 1102 or the inaudibility selection element 1104, the user may select the selection element 1106 to provide the selection to the system. The system can determine, based on the selection indicating whether the output audio signal is audible to the user, the personal average gain level. For example, when the system receives the selection of the audibility selection element 1102 during the second phase of the first stage, the system can determine that the personal average gain level for the user corresponds to average hearing loss level 704 of the mild to moderate hearing loss profile group. This hearing loss profile group may be used as a basis for further exploration of level-and-frequency-dependent audio filters in the second stage of the enrollment procedure. By contrast, when the system receives the selection of the inaudibility selection element 1104 during the second phase, the system can determine that the personal average gain level for the user corresponds to average hearing loss level 804 of the moderate hearing loss profile group. This hearing loss profile group may be used as a basis for further exploration of level-and-frequency-dependent audio filters in the second stage of the enrollment procedure.

The first audio signal can be generated and/or output during the first stage using the one or more predetermined gain levels in an order of increasing gain. For example, as described above, the first audio signal can be output at 40 dB during the first phase and then at 55 dB during the second phase as the user progresses through the first stage of the enrollment procedure. Play back of the speech signal using the increasing predetermined gain levels can continue until the personal average gain level is determined. Determination of the personal average gain level can be made through selection of the audibility selection element 1102 or selection of the inaudibility selection element 1104. For example, if the user selects the audibility selection element 1102 when the speech signal is output at 55 dB, the personal average gain level corresponding to the mild to moderate hearing loss profile is determined. By contrast, if the user selects the inaudibility selection element 1104 after outputting the speech signal at 55 dB, the personal average gain level corresponding to the moderate hearing loss profile is determined.

The first audio signal may be set at a calibrated level, and thus, volume adjustment during the first stage of the enrollment process may be disallowed. More particularly, one or more processors of the media system 100 can disable volume adjustment of the media system 100 during output of the first audio signal. By locking out the volume controls of media system 100 during the first stage of the enrollment process, the gain levels that compensate for hearing loss can be set to the predetermined gain levels that correspond to the common hearing loss profiles that are being tested for. Accordingly, the levels can be explored using the speech stimulus at predetermined levels that are fixed during the evaluation.

Figure 12:
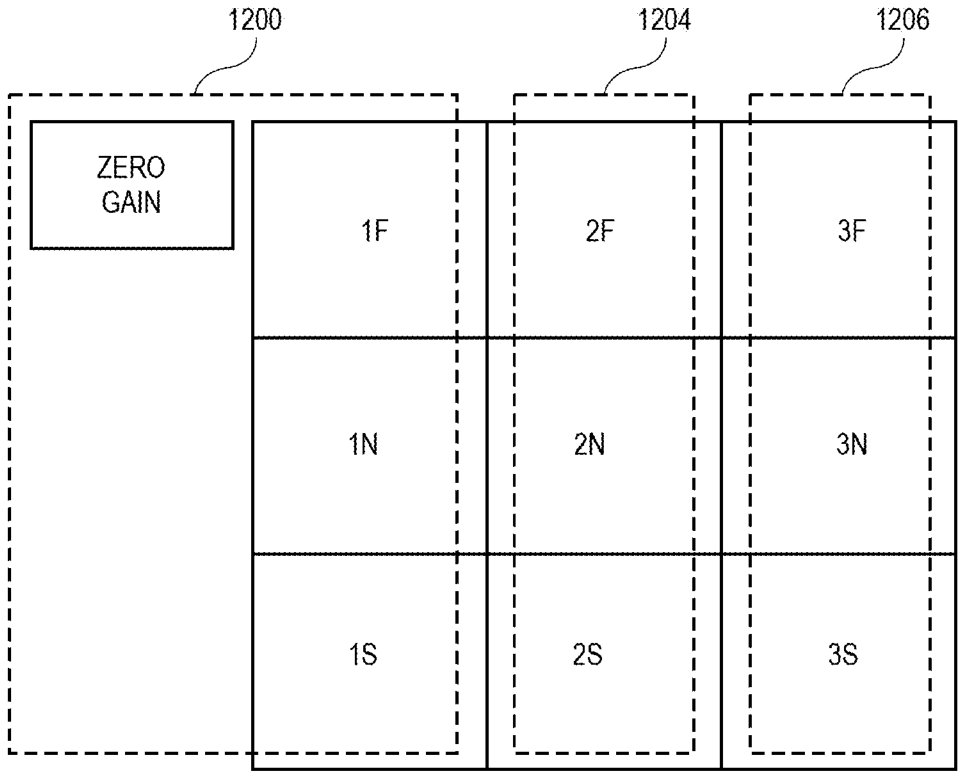
FIG. 12 is a pictorial view of a selection of groups of level-and-frequency-dependent audio filters for exploration in a second stage of the enrollment procedure, in accordance with an aspect.

Referring to FIG. 12, a pictorial view of selections of groups of level-and-frequency-dependent audio filters for exploration in a second stage of the enrollment procedure is shown in accordance with an aspect. The selections during the first stage of the enrollment procedure drive the groups of level-and-frequency-dependent audio filters made available for exploration during the second stage of the enrollment procedure.

When the speech signal is presented at a first level, e.g., 40 dB, during the first phase of the first stage of the enrollment procedure, the user makes a selection to indicate whether the output audio signal is audible. Selection of the audibility selection element 1102 indicates that the first level is audible, and may be termed a first phase audibility selection 1200. The system can determine, based on the first phase audibility selection 1200, that a zero gain audio filter and/or a first group of level-and-frequency-dependent audio filters (1F, 1N, and 1S) have respective average gain levels equal to a personal average gain level of the user. More particularly, the system can determine, in response to first phase audibility selection 1200, that the personal average gain level of the user is one of the average gain levels of the zero gain audio filter or the first group of level-and-frequency-dependent audio filters (1F, 1N, and 1S). For example, the zero gain audio filter can have an average gain level of zero, and the first group of filters can have an average gain level corresponding to the first group 602 of hearing loss profiles. One or more of the audio filters can be explored during the second stage of the enrollment procedure to further narrow the determination, as described below.

When the speech signal is presented at a second level, e.g., 55 dB, during the second phase of the first stage of the enrollment procedure, the user makes a selection to indicate whether the output audio signal is audible. Selection of the audibility selection element 1102 indicates that the second level is audible, and may be termed a second phase audibility selection 1204. The system can determine, based on the second phase audibility selection 1204, that a second group of level-and-frequency-dependent audio filters (2F, 2N, and 2S) has an average gain level equal to a personal average gain level of the user. More particularly, the personal average gain level of the user can be determined to be the average gain level of the second group. For example, the second group of filters can have an average gain level corresponding to the second group 702 of hearing loss profiles. One or more of the audio filters of the second group can be explored during the second stage of the enrollment procedure, as described below.

Selection of the inaudibility selection 1104 during presentation of the speech signal at the second level indicates that the second level is inaudible, and may be termed a second phase inaudibility selection 1206. The system can determine, based on the second phase inaudibility selection 1206, that a third group of level-and-frequency-dependent audio filters (3F, 3N, and 3S) has an average gain level equal to a personal average gain level of the user. More particularly, the personal average gain level of the user can be determined to be the average gain level of the third group. For example, the third group of filters can have an average gain level corresponding to the third group 802 of hearing loss profiles. One or more of the audio filters of the third group can be explored during the second stage of the enrollment procedure, as described below.

In the second stage of the enrollment process, the user can explore the determined group(s) of level-and-frequency-dependent audio filters to select a personal gain contour. The personal gain contour can correspond to the user-preferred gain contour (flat, notched, or sloped) that adjusts audio input signal tonal characteristics to the liking of the user.

Figure 13:
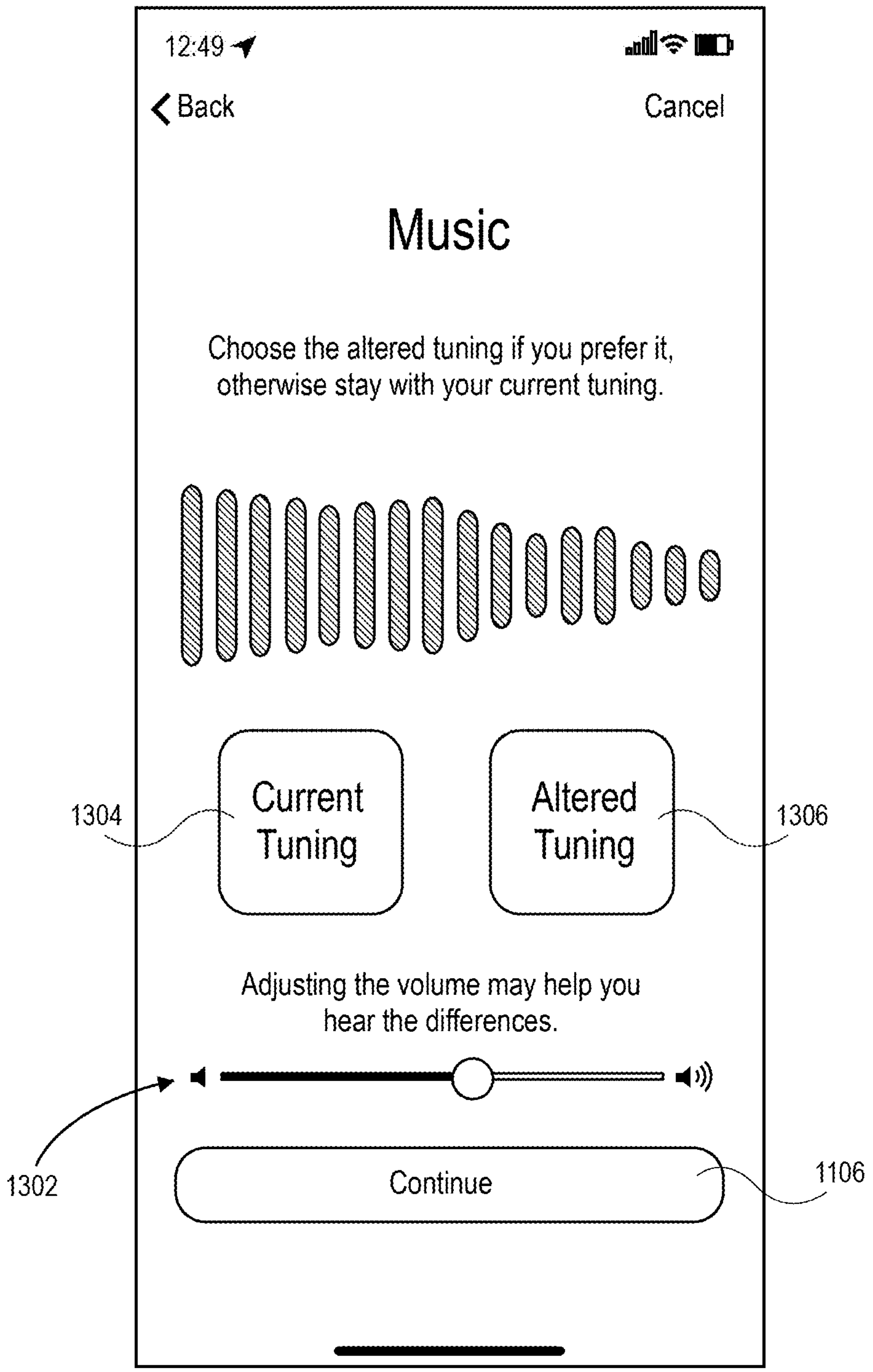
FIG. 13 is a pictorial view of a user interface to control output of a second audio signal, in accordance with an aspect.

Referring to FIG. 13, a pictorial view of a user interface to control output of a second audio signal is shown in accordance with an aspect. During the enrollment process, media system 100 can output a second audio signal using a group of level-and-frequency-dependent audio filters. The second audio signal can represent music, e.g., a music file containing recorded music. Music gives good contrast between timbre (as compared to speech), and thus, can facilitate the selection of an appropriate gain contour during the second stage of the enrollment process. More particularly, playing music during the second stage instead of speech allows a timbre or a tone preference of the user to be accurately determined.

During the second stage, audio input signal 404 can be sequentially reproduced for the user with different tonal enhancement settings. More particularly, the group(s) of level-and-frequency-dependent audio filters determined in response to the first phase audibility selection 1200, the second phase audibility selection 1204, or the second phase inaudibility selection 1206 are used to output the second audio signal. Each of the members of the groups can have different train contours. For example, each group (other than the zero gain audio filter) can include a flat audio filter corresponding to a flat loss contour of a common hearing loss profile, a notched audio filter corresponding to a notched loss contour of a common hearing loss profile, and a sloped audio filter corresponding to a sloped loss contour of a common hearing loss profile. It will be appreciated that, with reference to the loss contours above and the inverse relationship between the loss contours and the respective gain contours, that the gain contour of the flat audio filter has a highest gain at a low frequency band, the gain contour of the notched audio filter has a highest gain at an intermediate frequency band, and the gain contour of the sloped audio filter has a highest gain at a high frequency band. The audio filters are applied to the second audio signal to play back the audio signal such that different frequencies are pronounced corresponding to different hearing loss contours.

The user can select current tuning element 1304 to play the second audio signal with a first play back setting. For example, when the first phase audibility selection 1200 was made in FIG. 12, the second audio signal may be played back without audio filtering (zero gain filter) as the current tuning. The user can select the altered tuning element 1306 to play the second audio signal with a second audio filter having a respective gain contour, which is different than the gain contour of the first setting. For example, the altered tuning can play the second audio signal with the (1F) audio filter. When the user has identified the preferred setting, e.g., the tuning that allows the user to better hear the music of the second audio signal, the user can select selection element 1106. Alternatively, the user can make a selection through a physical switch, such as by tapping a button on audio signal device 102 or audio output device 104.

Figure 14B:
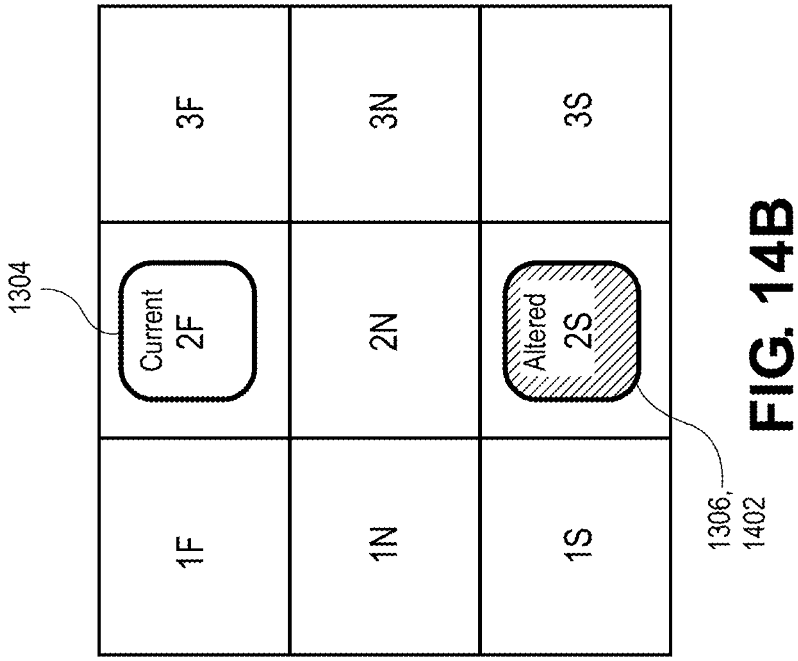
FIGS. 14A-14B are pictorial views of selections of level-and-frequency-dependent audio filters having different gain contours, in accordance with an aspect.
Figure 14A:
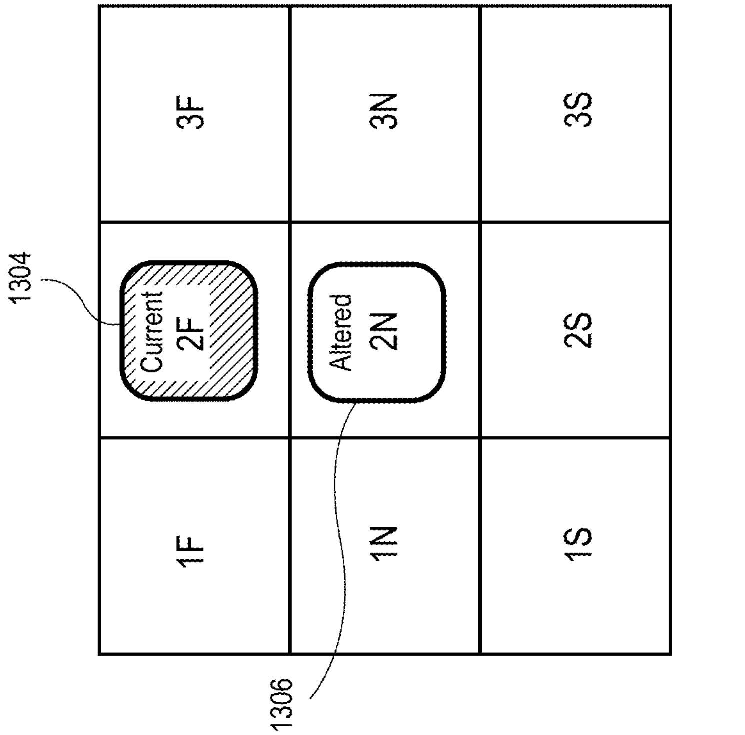

Referring to FIG. 14A, a pictorial view of selections of level-and-frequency-dependent audio filters having different gain contours is shown in accordance with an aspect. During the second stage of the enrollment process, different enhancement settings are presented to the user and the user is asked to choose a preferred setting. The enhancement settings include the group of level-and-frequency-dependent audio filters that are applied to the second audio signal based on the selection made during the first stage of the enrollment process. The audio filters in the group can correspond to hearing loss profiles having different loss contours.

In the illustrated example, the second phase audibility selection 1204 was made in FIG. 12. As a result, the system can select the second group of level-and-frequency-dependent audio filters for exploration. Selection of the current tuning element 1304 plays back the second audio signal using the flat gain contour (2F) audio filter corresponding to the flat loss contour 706 of FIG. 7. By contrast, selection of the altered tuning element 1306 plays back the second audio signal using the notched gain contour (2N) audio filter corresponding to the notched loss contour 708 of FIG. 7. The user may select the preferred setting and then select the selection element 1106 to advance to a next operation in the second stage. For example, the user may (as shown) select the current tuning element 1304 to choose the filter corresponding to the flat loss contour and continue to the next operation.

The second stage of the enrollment process may require presentation of all gain contour settings in the vertical direction across the grid of FIG. 14A. More particularly, even when the user selects the current tuning, e.g., the (2F) audio filter, during the second stage, the enrollment process can provide an additional comparison between the current tuning and a subsequent tuning. The subsequent tunings that may be applied to the second audio signal are shown in the columns of the grid of FIG. 14A. More particularly, the additional altered tunings can correspond to the sloped loss contour for each of the possible average gain level settings.

Referring to FIG. 14B a pictorial view of selections of level-and-frequency-dependent audio filters having different gain contours is shown in accordance with an aspect. At a next operation in the second stage of enrollment, the second audio signal can be modified by the (2F) level-and-frequency-dependent audio filter corresponding to the previously-selected gain contour setting and a next gain contour setting (2S). In an aspect, all of the tunings applied to the second audio signal during the second stage of enrollment have a same average gain level. More particularly, the flat gain contour (2F), notched gain contour (2N), and sloped gain contour (2S) applied to the second audio signal for comparison of tonal adjustments can all have the personal average gain level determined during the first stage of enrollment. The personal average gain level can correspond, for example, to the average gain loss 704 for the mild to moderate hearing loss group profile. When the user has listened to the second audio signal altered by all filters, the user may select a preferred tuning, e.g., the altered tuning 1306. Media system 100 can receive the user selection as a selection of a personal gain contour 1402. For example, personal gain contour 1402 can be a sloped gain contour (2S).

In contrast to the first stage of the enrollment process, volume adjustment of media system 100 can be enabled during output of the second audio signal. Allowing volume adjustment can help distinguish between tonal characteristics of the different audio signal adjustments. More particularly, allowing the user to adjust the volume of media system 100 using a volume control 1302 (FIG. 13) may allow the user to hear differences between each of the tonal settings. Accordingly, the second stage of the enrollment process allows the user to explore gain contours using a music stimulus that excites all frequencies in the audible frequency range, and volume changes are encouraged to allow the user to distinguish between tonal characteristics of the altered music stimuli.

A sequence of presentation of filtered audio signals allows the user to step through the enrollment process to first determine a personal average gain level and then determine a personal gain contour. More particularly, the user can first select the personal average gain level by selecting a setting at which the first audio signal is audible, and then select personal gain contour 1402 by stepping through the grid in the vertical direction along a shape axis. Each square of the grid represents a level-and-frequency-dependent audio filter having a respective average gain level and gain contour, and thus, the illustrated example (3×3 grid) assumes that personal level-and-frequency dependent audio filter 402 that results from the enrollment process will be one of 9 level-and-frequency-dependent audio filters corresponding to 9 common hearing loss profiles. This level of granularity, e.g., three level groups and three contour groups, has been shown to consistently lead users to select the preset that the users consistently preferred, whether or not the selected preset precisely matched their hearing loss profile. It will be appreciated, however, that the number of presets used in the enrollment process can vary. For example, the first stage of the enrollment process could allow the users to step through four or more predetermined gain levels to drive the selection of audio filter groups having the personal average gain level. Similarly, more or fewer gain contours may be represented across the shape axis of the grid to allow the user to assess different tonal enhancements.

Figure 15:
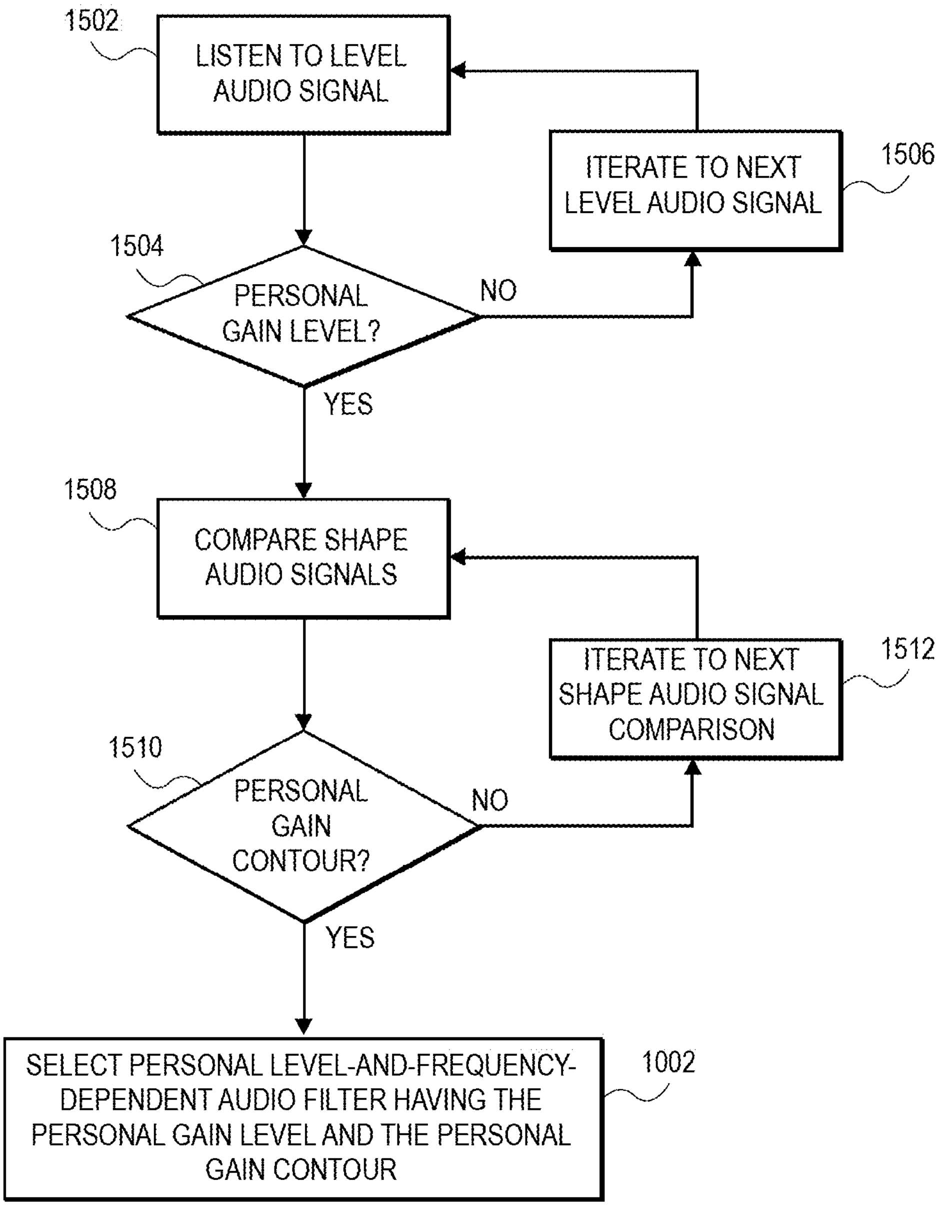
FIG. 15 is a flowchart of a method of selecting a personal level-and-frequency dependent audio filter having a personal average gain level and a personal gain contour, in accordance with an aspect.

Referring to FIG. 15, a flowchart of a method of selecting a personal level-and-frequency dependent audio filter having a personal average gain level and a personal gain contour is shown in accordance with an aspect. The flowchart illustrates the enrollment process stages to select the level-and-frequency-dependent audio filter from an audio filter grid having columns and rows.

As described above, the enrollment process allows the user to first explore levels to determine a correct column within the audio filter grid for further exploration of contours. At operation 1502, in the first stage of the enrollment process, the user listens to an audio signal at a predetermined level, e.g., a 40 dB level. The predetermined level is a presentation level resulting from a predetermined gain level being applied to the speech audio signal. At operation 1504, media system 100 determines whether the user can hear the current presentation level. For example, if the user can hear the 40 dB level resulting from the predetermined gain level audio filter, the user selects the audibility selection element 1102 to identify the current level as corresponding to the personal average gain level. In such case, the system determines that the personal average gain level is the average gain level of the zero gain filter or the (1F, 1N, 1S) audio filter group. If, however, the user selects the inaudibility selection element 1104, at operation 1506 the first decision sequence iterates to a next predetermined level, e.g., a 55 dB level.

The next predetermined level is a presentation level resulting from a next predetermined gain level being applied to the speech audio signal. The audio signal can be presented at the next predetermined level at operation 1502. At operation 1504, media system 100 determines whether the user can hear the current level. If the user can hear the current level, the user selects the audibility selection element 1102 to identify the current level as corresponding to the personal average gain level. In such case, the system determines that the personal average gain level is the average gain level of the (2F, 2N, 2S) audio filter group. If the user selects the inaudibility selection element 1104, however, the system determines that the personal average gain level is the average gain level of the (3F, 3N, 3S) audio filter group. Whichever level the user selects as being audible during the iterations can be used to drive the determination of the personal average gain level. When the user selects the audible level, the system can determine the audio filter groups for further exploration which have average gain levels corresponding to the selected predetermined gain level. More particularly, the personal average gain level can be determined from the audibility selections and the enrollment process can continue to the second stage.

As described above, the enrollment process allows the user to explore gain contours within the selected audio filter groups to determine a correct row within the audio filter grid, and thus, arrive at the square within the grid that represents personal level-and-frequency dependent audio filter 402. At operation 1508, in the second stage of the enrollment process, the user compares several shape audio signals.

In a special case, the user makes first phase audibility selection 1200 and the system determines that the zero gain audio filter or the (1F, 1N, 1S) audio filter group correspond to the personal average gain level of the user. In such case, the music file is played at the decision sequence 1508. At decision sequence 1508, a comparison can be made between the zero gain audio filter (or no filter) applied to the music audio signal and the low-gain flat audio filter (1F) applied to the music audio signal. If the zero gain audio filter is again selected, e.g., via the current tuning element 1304, the process can iterate to compare the zero gain audio filter to the low-gain notched audio filter (1N). If the zero gain audio filter is again selected, e.g., via the current tuning element 1304, the enrollment process can end and no audio filter is applied to audio input signal 404. More particularly, when the flowchart advances through the sequence with the user selecting the zero gain audio filter over the several level-and-dependent audio filters corresponding to the hearing loss profiles, media system 100 determines that the user has normal hearing and no adjustments are made to the default audio settings of the system. This may also be framed as the personal level-and-frequency-dependent audio filter having a personal average gain level of zero and a personal gain contour of non-adjustment.

In the event that the user selects a non-zero personal average gain level, however, e.g., the second phase audibility selection 1204 or the second phase inaudibility selection 1206 is selected during the first stage, or the (1F) or (1N) audio filters are selected at the initial operation 1508 of the second stage, the shape audio signal comparison at operation 1508 is between the non-zero gain audio filters applied to the music audio signal. For example, if the second phase audibility selection 1204 drove the selection of the (2F, 2N, 2S) audio filter group for further exploration, then at operation 1508 the (2F) audio filter can be applied to the music audio signal as the current tuning and the low-level notched audio filter (2N) can be applied to the music audio signal as the altered tuning. The filtered audio signals can be presented to the user as respective shape audio signals. At operation 1510, media system 100 determines whether the user has selected a personal gain contour 1402. The personal gain contour 1402 is selected after the user has listened to all shape audio signals and selected a preferred shape audio signal. For example, if the user selects the (2F) audio filter over the (2N) audio filter at operation 1508, the (2F) audio filter is a candidate for the personal gain contour 1402. At operation 1512, the second stage iterates to a next shape audio signal comparison. For example, the (2F) audio filter selected during a previous iteration can be applied to the music audio signal and the low-level sloped audio filter (2S) can be applied to the music audio signal. The filtered audio signals can be presented to the user as respective shape audio signals at operation 1508, and the user can select the preferred shape audio signal. At operation 1510, media system 100 determines whether the user has selected personal gain contour 1402. For example, if the user selects the (2S) audio filter, media system 100 identifies the selection as personal gain contour 1402 given that the user selected the audio filter and all shape audio signals have been presented to the user for selection.

After the level and contour settings are explored, at operation 1002, media system selects personal level-and-frequency dependent audio filter 402. More particularly, the user identifies a particular square in the grid, e.g., based in part on personal level-and-frequency dependent audio filter 402 having the personal average gain level determined from the first stage, and based in part on personal level-and-frequency dependent audio filter 402 having personal gain contour 1402 determined from the second stage. The selected filter having the personal average gain level and personal gain contour 1402 can be used by the process in a verification operation. At the verification operation, an audio signal, e.g., a music audio signal, can be output and played back by media system 100 using personal level-and-frequency dependent audio filter 402 that was identified during the enrollment process. The verification operation allows the user to adjust between the selected preset and normal play (no adjustment) so that the user can confirm that the adjustment is in fact an improvement. When the user agrees that the personal level-and-frequency dependent audio filter improves a listening experience, the user can select an element, e.g., "done," to complete the enrollment process.

At the conclusion of the enrollment process, personal level-and-frequency dependent audio filter 402 is identified as the audio filter having the preferred personal average gain level and/or personal gain contour 1402 of the user. Accordingly, at operation 1002, media system 100 can select personal level-and-frequency dependent audio filter 402 based in part on personal level-and-frequency dependent audio filter 402 having the personal average gain level, and based in part on personal level-and-frequency dependent audio filter 402 having personal gain contour 1402, as determined by the enrollment process.

Figure 16:
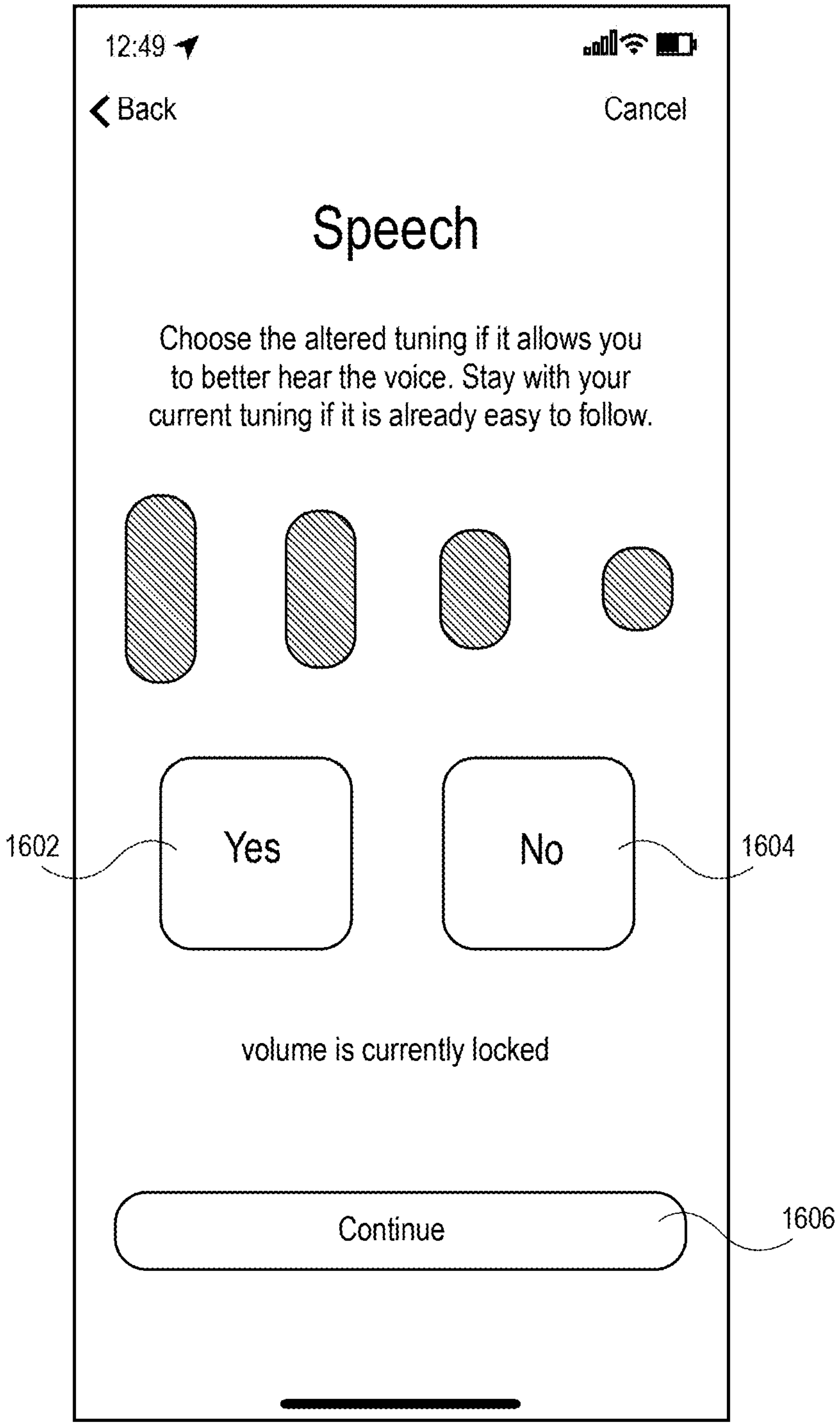
FIG. 16 is a pictorial view of a user interface to control output of a first audio signal, in accordance with an aspect.

In an alternative embodiment, the enrollment procedure can differ from the process described above with respect to FIGS. 11-15. The alternative embodiment is described below with respect to FIGS. 16-20. Like the embodiment of FIGS. 11-15, the embodiment of FIGS. 16-20 allow the user to select one or more of the level-and-frequency-dependent audio filters, and through the user selections, media system 100 can determine and/or select an appropriate personal level-and-frequency dependent audio filter to apply to an audio input signal for the user. Referring to FIG. 16, a pictorial view of a user interface to control output of a first audio signal is shown in accordance with an aspect. During the enrollment process, media system 100 can output a first audio signal using a first group of level-and-frequency-dependent audio filters. For example, the first audio signal can represent speech, e.g., a speech file containing recorded greetings spoken in languages from around the world. Speech gives good contrast between gain levels (as compared to music), and thus, can facilitate the selection of an appropriate average gain level during a first stage of the enrollment process. During the first stage, audio input signal 404 can be sequentially reproduced for the user with different enhancement settings. More particularly, level-and-frequency-dependent audio filters having different average gain levels can be applied to the first audio signal to play back the audio signal at different average gain levels corresponding to different average hearing loss levels, e.g., levels 604, 704, or 804.

The user can select a current tuning element 1602 of a graphical user interface displayed on audio signal device 102 of media system 100 to play the first audio signal with a first level of amplification. After listening to the first setting, the user can select an altered tuning element 1604 of the graphical user interface to play the first audio signal with a second level of amplification, which is higher than the first level of amplification. When the user has identified the preferred setting, e.g., the tuning that allows the user to better hear the speech of the first audio signal, the user can select a selection element 1606 of the graphical user interface. Alternatively, the user can make a selection through a physical switch, such as by tapping a button on audio signal device 102 or audio output device 104. If the user selects selection element 1606 while current tuning element 1602 is enabled, the selection can be a personal average gain level 1702. More particularly, the personal average gain level 1702 can be the average gain level applied to the first audio signal when the user decides to continue the enrollment process using the current tuning. Alternatively, the user may choose to continue the enrollment with the altered tuning element 1604 enabled. In such case, the selection causes the enrollment process to progress to a next operation in the first stage. At the next operation, the first audio signal can be reproduced by another pair of level-and-frequency-dependent audio filters.

Figure 17B:
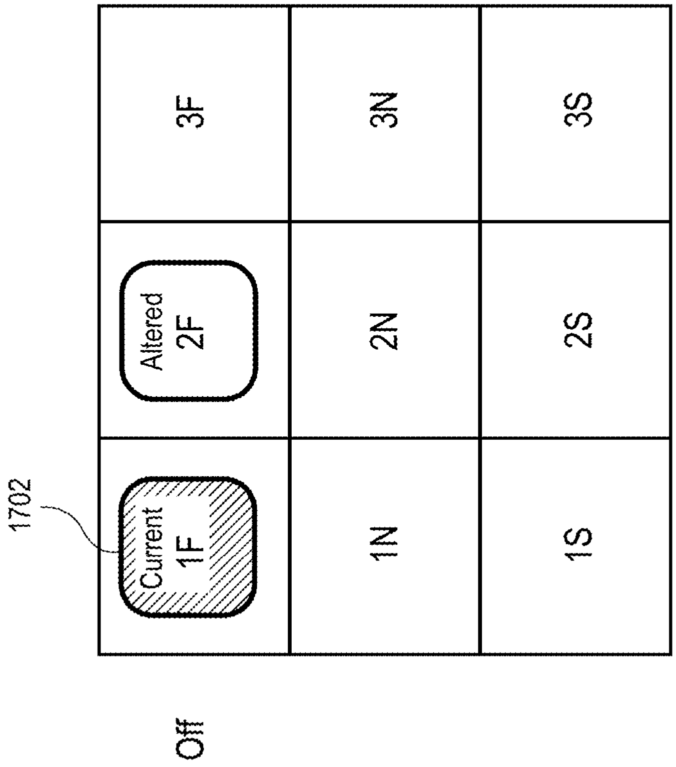
FIGS. 17A-17B are pictorial views of selections of level-and-frequency-dependent audio filters having different average gain levels, in accordance with an aspect.
Figure 17A:
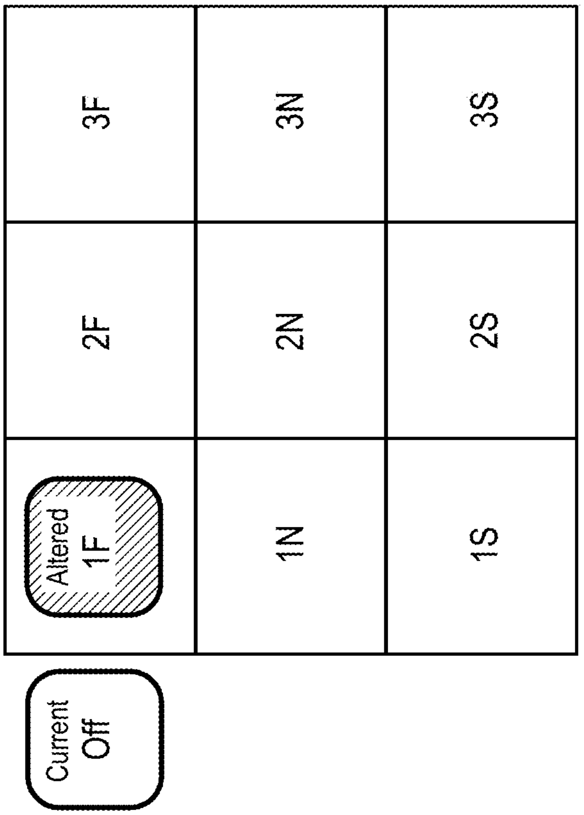

Referring to FIG. 17A, a pictorial view of selections of level-and-frequency-dependent audio filters having different average gain levels is shown in accordance with an aspect. During the first stage of the enrollment process, different enhancement settings are presented to the listener and the listener is asked to choose a preferred setting. The enhancement settings include the first group of level-and-frequency-dependent audio filters that are applied to the first audio signal, and the filters can correspond to hearing loss profiles having different average gain levels. For example, the current tuning can initially be a zero average gain level (no gain level applied to the input signal, or "off"). The altered tuning can be the level-and-frequency-dependent audio filter (1F) corresponding to one of the loss contours in first group 602 of FIG. 6 (first level, flat contour). It will be appreciated that the subsequent tunings that may be applied to the first audio signal are shown in the top row of the grid of FIG. 17A. More particularly, additional altered tunings (2F) and (3F) correspond to a loss contour of second group 702 of FIG. 7 (second level, flat contour) and a loss contour of third group 802 of FIG. 8 (third level, flat contour). At the first stage shown in FIG. 17A, the user can listen to the first audio signal having the current tuning and altered tuning applied, and select the altered tuning, indicating a user preference for more gain applied to the first audio signal. Referring to FIG. 17B, a pictorial view of selections of level-and-frequency-dependent audio filters having different average gain levels is shown in accordance with an aspect. At a next operation in the first stage of enrollment, the first audio signal can be modified by the (1F) level-and-frequency-dependent audio filter as the current tuning. The first audio signal can also be modified by the (2F) level-and-frequency-dependent audio filter as the altered tuning. In an aspect, all of the tunings applied to the first audio signal during the first stage of enrollment have a same gain contour. For example, the tunings can be filters that correspond to the flat loss contours shown in FIGS. 6-8, and thus, can all have flat gain contours (inversely related to the flat loss contours). Accordingly, the current tuning in FIG. 17B can have an average gain level corresponding to the average loss level 604 of FIG. 6, and the altered tuning can have an average gain level corresponding to the average loss level 704 of FIG. 7. When the user has listened to the first audio signal altered by both filters, the user may select the current tuning as the preferred tuning. Media system 100 can receive the user selection as a selection of personal average gain level 1702, e.g., 20 dB.

It will be appreciated that, should the user prefer the altered tuning in FIG. 17B, selection of the altered tuning would cause the enrollment process to progress to a next operation in the first stage. In the next operation, the first audio signal can be reproduced using level-and-frequency-dependent audio filters (2F) and (3F) corresponding to loss contours in FIG. 7 and FIG. 8. A description of such an operation is omitted here for brevity.

In an aspect, the first audio signal is output to the user using level-and-frequency-dependent audio filters of the first group in an order of increasing average gain levels. For example, in FIG. 17A, the first audio signal was presented with the current tuning of zero gain and the altered tuning (1F) corresponding to the average hearing loss 604 of FIG. 6, e.g., 20 dB average gain level. In FIG. 17B, the first audio signal was presented with the tunings (1F) and (2F) corresponding to the average hearing loss of FIGS. 6 and 7, e.g., 20 dB and 35 dB average gain levels. Accordingly, the audio signal alterations can be presented in an order of increasing gain. It will be appreciated that presentation of the audio signal level comparisons in the increasing order, as described above, can expedite the enrollment process. More particularly, because it would be unusual for a user to want a third level of gain more than a first level of gain, but not to want a second level of gain more than the first level of gain, it does not make sense to present the third level of gain if the user has selected the first level of gain over the second level of gain. Elimination of the additional comparison (comparing the third level of gain to the first level of gain) can shorten the enrollment process.

In an aspect, the first audio signal can have some noise embedded to provide realism to the listening experience. By way of example, the first audio signal can include a speech signal representing speech, and a noise signal representing noise. The speech signal and the noise signal can be embedded at a particular ratio such that an increase in level of the first audio signal brings up the level of both the speech and the noise audio content in the speech file. For example, a ratio of the speech signal to the noise signal can be in a range of 10 to 30 dB, e.g., 15 dB. The ratio may be high enough that noise does not overpower the speech. Progressive amplification of the noise with each increase in average gain level, however, may deter the user from selecting a level-and-frequency-dependent audio filter that unnecessarily boosts the volume of the audio signal. More particularly, the embedded noise provides realism to help the user select an amplification level that compensates, but does not overcompensate, for the user's hearing loss.

The first audio signal may be set at a calibrated level, and thus, volume adjustment during the first stage of the enrollment process may be disallowed. More particularly, one or more processors of the media system 100 can disable volume adjustment of the media system 100 during output of the first audio signal. By locking out the volume controls of media system 100 during the first stage of the enrollment process, the gain levels that compensate for hearing loss can be set to the average gain levels of the level-and-frequency-dependent audio filters that correspond to the common hearing loss profiles that are being tested for. Accordingly, the levels can be explored using a speech stimulus at a fixed level.

In addition to allowing a selection of the personal average gain level 1702 during the first stage, the enrollment process can include a second stage to select a personal gain contour. The personal gain contour can correspond to the user-preferred gain contour (flat, notched, or sloped) that adjusts audio input signal tonal characteristics to the liking of the user.

Figure 18:
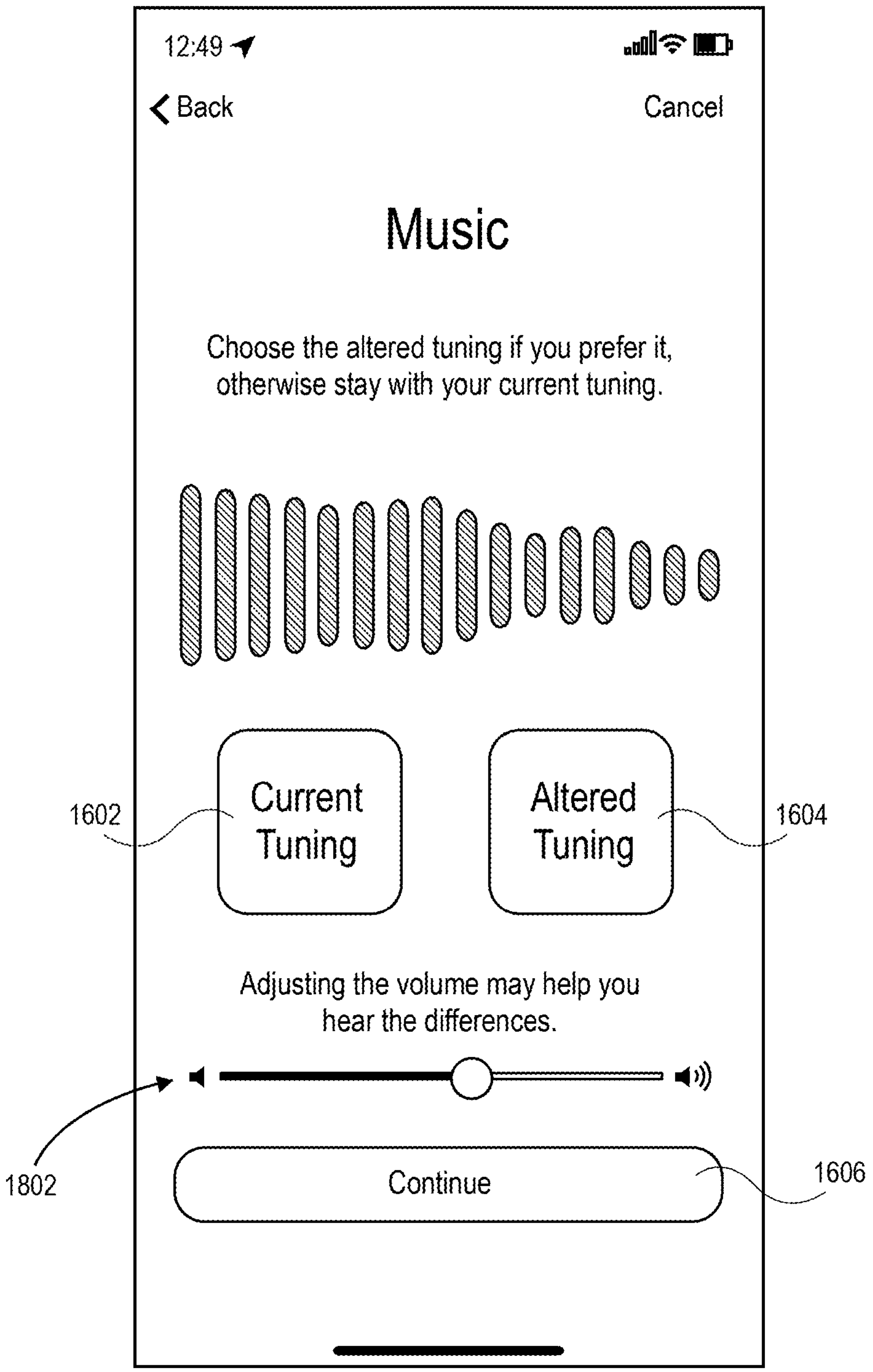
FIG. 18 is a pictorial view of a user interface to control output of a second audio signal, in accordance with an aspect.

Referring to FIG. 18, a pictorial view of a user interface to control output of a second audio signal is shown in accordance with an aspect. During the enrollment process, media system 100 can output a second audio signal using a second group of the level-and-frequency-dependent audio filters. The second audio signal can represent music, e.g., a music file containing recorded music. Music gives good contrast between timbre (as compared to speech), and thus, can facilitate the selection of an appropriate gain contour during a second stage of the enrollment process. More particularly, playing music during the second stage instead of speech allows a timbre or a tone preference of the user to be accurately determined.

During the second stage, audio input signal 404 can be sequentially reproduced for the user with different tonal enhancement settings. More particularly, the second group of level-and-frequency-dependent audio filters used to output the second audio signal can have different gain contours. The second group can include a flat audio filter corresponding to a flat loss contour of a common hearing loss profile, a notched audio filter corresponding to a notched loss contour of a common hearing loss profile, and a sloped audio filter corresponding to a sloped loss contour of a common hearing loss profile. It will be appreciated that, with reference to the loss contours above and the inverse relationship between the loss contours and the respective gain contours, that the gain contour of the flat audio filter has a highest gain at a low frequency band, the gain contour of the notched audio filter has a highest gain at an intermediate frequency band, and the gain contour of the sloped audio filter has a highest gain at a high frequency band. The audio filters are applied to the second audio signal to play back the audio signal such that different frequencies are pronounced corresponding to different hearing loss contours.

The user can select current tuning element 1602 to play the second audio signal with a first audio filter having a respective gain contour. After listening to the first setting, the user can select altered tuning element 1604 to play the second audio signal with a second audio filter having a respective gain contour, which is different than the gain contour of the first audio filter. When the user has identified the preferred setting, e.g., the tuning that allows the user to better hear the music of the second audio signal, the user can select selection element 1606. Alternatively, the user can make a selection through a physical switch, such as by tapping a button on audio signal device 102 or audio output device 104.

Figure 19B:
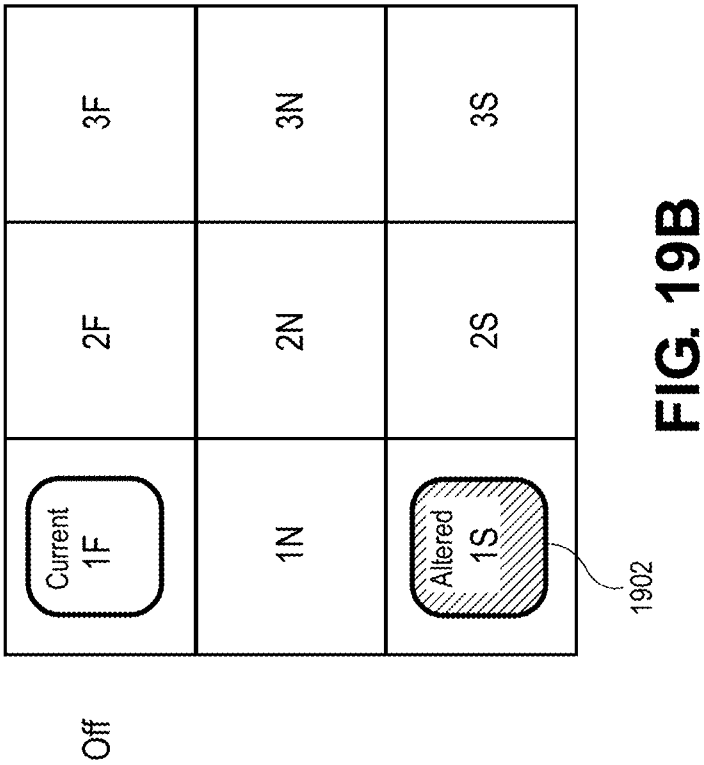
FIGS. 19A-19B are pictorial views of selections of level-and-frequency-dependent audio filters having different gain contours, in accordance with an aspect.
Figure 19A:
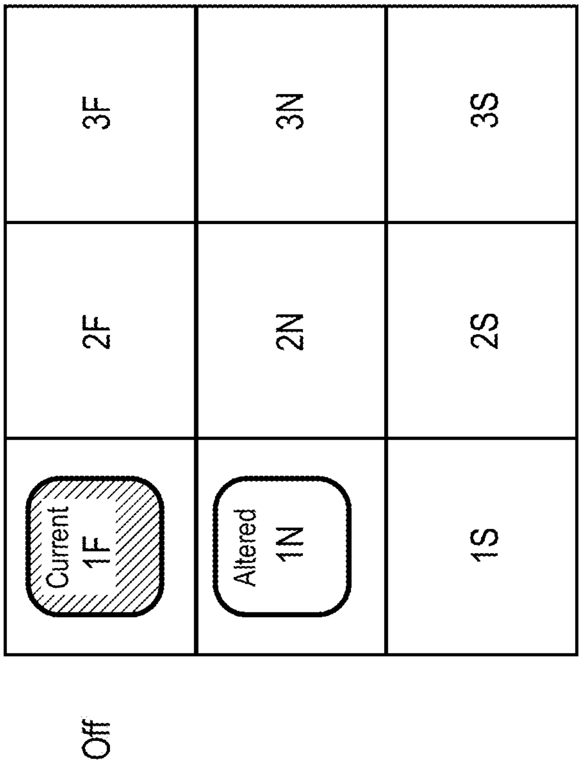

Referring to FIG. 19A, a pictorial view of selections of level-and-frequency-dependent audio filters having different gain contours is shown in accordance with an aspect. During the second stage of the enrollment process, different enhancement settings are presented to the listener and the listener is asked to choose a preferred setting. The enhancement settings include the second group of level-and-frequency-dependent audio filters that are applied to the second audio signal, and the filters can correspond to hearing loss profiles having different loss contours. For example, the current tuning can initially be a flat gain contour (1F) corresponding to the flat loss contour 606 of FIG. 6. The altered tuning can be the (1N) level-and-frequency-dependent audio filter corresponding to notched loss contour 608 of FIG. 6. The user may prefer the filter corresponding to the flat loss contour and select the selection element 1606 to advance to a next operation in the second stage.

Whereas the first stage of the enrollment process did not require presentation of all average gain level settings as represented in the horizontal direction across the grid of FIG. 17A, the second stage of the enrollment process may require presentation of all gain contour settings in the vertical direction across the grid of FIG. 19A. More particularly, even when the user selects the current tuning during the second stage, the enrollment process can provide an additional comparison between the current tuning and a subsequent tuning. The subsequent tunings that may be applied to the second audio signal are shown in the columns of the grid of FIG. 19A. More particularly, the additional altered tunings can correspond to the sloped loss contour for each of the possible average gain level settings.

Referring to FIG. 14B a pictorial view of selections of level-and-frequency-dependent audio filters having different gain contours is shown in accordance with an aspect. At a next operation in the second stage of enrollment, the second audio signal can be modified by the (1F) level-and-frequency-dependent audio filter corresponding to the previously-selected gain contour setting and a next gain contour setting (1S). In an aspect, all of the tunings applied to the second audio signal during the second stage of enrollment have a same average gain level. More particularly, the flat gain contour (1F), notched gain contour (1N), and sloped gain contour (1S) applied to the second audio signal for comparison of tonal adjustments can all have the personal average gain level 1702 selected during the first stage of enrollment. When the user has listened to the second audio signal altered by all filters, the user may select a preferred tuning, e.g., the altered tuning. Media system 100 can receive the user selection as a selection of a personal gain contour 1902. For example, personal gain contour 1902 can be a sloped gain contour (1S).

In contrast to the first stage of the enrollment process, volume adjustment of media system 100 can be enabled during output of the second audio signal. Allowing volume adjustment can help distinguish between tonal characteristics of the different audio signal adjustments. More particularly, allowing the user to adjust the volume of media system 100 using a volume control 2302 (FIG. 18) may allow the user to hear differences between each of the tonal settings. Accordingly, the second stage of the enrollment process allows the user to explore gain contours using a music stimulus that excites all frequencies in the audible frequency range, and volume changes are encouraged to allow the user to distinguish between tonal characteristics of the altered music stimuli.

A sequence of presentation of filtered audio signals allows the user to step through the grid in the horizontal direction during the first stage and in the vertical direction during the second stage. More particularly, the user can first select personal average gain level 1702 by stepping through the grid in the horizontal direction along a level axis, and then select personal gain contour 1902 by stepping through the grid in the vertical direction along a shape axis. Each square of the grid represents a level-and-frequency-dependent audio filter having a respective average gain level and gain contour, and thus, the illustrated example (3×3 grid) assumes that personal level-and-frequency dependent audio filter 402 that results from the enrollment process will be one of 9 level-and-frequency-dependent audio filters corresponding to 9 common hearing loss profiles. This level of granularity, e.g., three level groups and three contour groups, has been shown to consistently lead users to select the preset that the users consistently preferred, whether or not the selected preset precisely matched their hearing loss profile. It will be appreciated, however, that the number of presets used in the enrollment process can vary. For example, the first stage of the enrollment process could allow the users to step through four or more average gain levels across a grid having more columns. Similarly, more or fewer gain contours may be represented across the shape axis of the grid to allow the user to assess different tonal enhancements.

Figure 20:
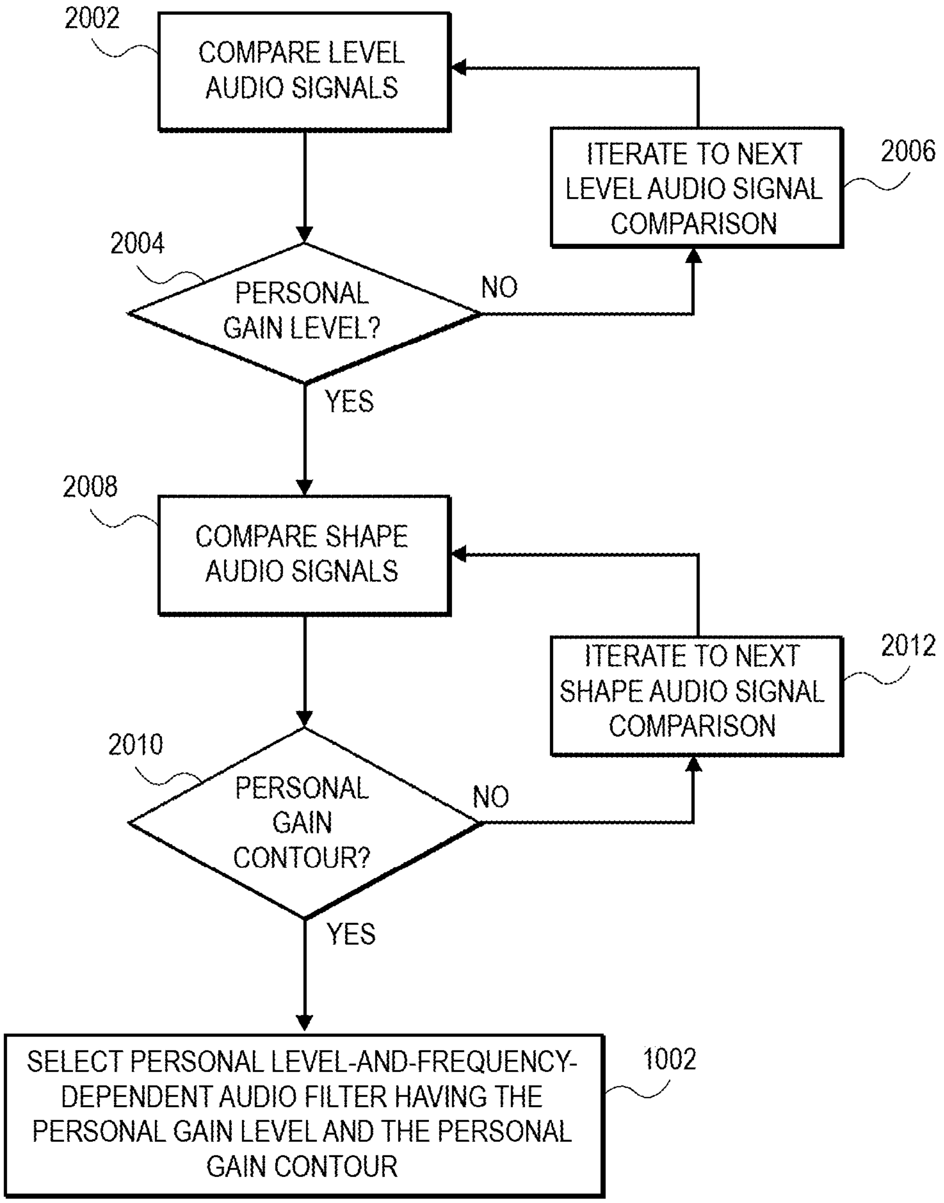
FIG. 20 is a flowchart of a method of selecting a personal level-and-frequency dependent audio filter having a personal average gain level and a personal gain contour, in accordance with an aspect.

Referring to FIG. 20, a flowchart of a method of selecting a personal level-and-frequency dependent audio filter having a personal average gain level and a personal gain contour is shown in accordance with an aspect. The flowchart illustrates the enrollment process stages to select the level-and-frequency-dependent audio filter from an audio filter grid having columns and rows.

As described above, the enrollment process allows the user to first explore levels to determine a correct column within the audio filter grid. At operation 2002, in the first stage of the enrollment process, the user compares several level audio signals, e.g., a current gain level and a next gain level. For example, the zero gain audio filter (no gain, or "off") can be applied to the speech audio signal as a current gain level and the low-gain flat audio filter (1F) can be applied to the speech audio signal as a next gain level. The filtered audio signals can be presented to the user as respective level audio signals. At operation 2004, media system 100 determines whether the user is satisfied with the current level. For example, if the user is satisfied with the zero gain audio filter, the user selects the zero gain audio filter as personal gain level 1702. If, however, the user selects the next audio level, e.g., the (1F) level-and-frequency-dependent audio filter, at operation 2006 the first decision sequence iterates to a next level audio signal comparison. For example, the (1F) filter can be applied to the speech audio signal as the current gain level and the mid-gain flat audio filter (2F) can be applied to the speech audio signal as the next gain level. The filtered audio signals can be presented to the user as respective level audio signals at operation 2002, and the user can select the preferred level audio signal. At operation 2004, media system 100 determines whether the user is satisfied with the current level. If the user is satisfied with the current level, the user selects the current level, which the system determines as personal gain level 1702. If the user is more satisfied with the next level, the user selects the next gain level and the system iterates to allow a comparison of a next group of level audio signals. For example, the sequence advances to allow the user to also compare the mid-gain flat audio filter (2F) and the high-gain flat audio filter (3F). Whichever current level the user selects during the iterations can be determined to be personal average gain level 1702. More particularly, when the user selects the zero gain audio filter, the (1F) filter, the (2F) filter, or the (3F) filter at the point in the process when the selected filter is the current (as compared to the next) audio filter, the selected audio filter can be determined to have personal gain contour 1902 and the enrollment process can continue to the second stage.

As described above, the enrollment process allows the user to explore gain contours within the selected gain level to determine a correct row within the audio filter grid, and thus, arrive at the square within the grid that represents personal level-and-frequency dependent audio filter 402. At operation 2008, in the second stage of the enrollment process, the user compares several shape audio signals.

In a special case, the user selects the zero gain audio filter as the personal gain level during the first stage. In such case the speech file is played at the decision sequence 2008. Similar to decision sequence 2002, at decision sequence 2008 a comparison can be made between the zero gain audio filter applied to the speech audio signal and the low-gain notched audio filter (1N) applied to the speech audio signal. If the zero gain audio filter is again selected, the process can iterate to compare the zero gain audio filter to the high-gain sloped audio filter (1S). If the zero gain audio filter is again selected, the enrollment process can end and no audio filter is applied to audio input signal 404. More particularly, when the flowchart advances through the sequence with the user selecting the zero gain audio filter over the several level-and-dependent audio filters corresponding to the hearing loss profiles, media system 100 determines that the user has normal hearing and no adjustments are made to the default audio settings of the system.

In the event that the user selects a non-zero personal gain level during the first stage, the shape audio signal comparison at operation 2008 is between the non-zero gain audio filters applied to the music audio signal. For example, if the (1F) audio filter was selected as the personal gain level at operation 2004, then at operation 2008 the (1F) audio filter can be applied to the music audio signal and the low-level notched audio filter (1N) can be applied to the music audio signal. The filtered audio signals can be presented to the user as respective shape audio signals. At operation 2010, media system 100 determines whether the user has selected a personal gain contour 1902. The personal gain contour 1902 is selected after the user has listened to all shape audio signals and selected a preferred shape audio signal. For example, if the user selects the (1F) audio filter over the (1N) audio filter at operation 2008, the (1F) audio filter is a candidate for the personal gain contour 1902. At operation 2012, the second stage iterates to a next shape audio signal comparison. For example, the (1F) audio filter selected during a previous iteration can be applied to the music audio signal and the low-level sloped audio filter (1S) can be applied to the music audio signal. The filtered audio signals can be presented to the user as respective shape audio signals at operation 2008, and the user can select the preferred shape audio signal. At operation 2010, media system 100 determines whether the user has selected personal gain contour 1902. For example, if the user selects the (1S) audio filter, media system 100 identifies the selection as personal gain contour 1902 given that the user selected the audio filter and all shape audio signals have been presented to the user for selection.

After the level and contour settings are explored, at operation 1002, media system selects personal level-and-frequency dependent audio filter 402. More particularly, the user identifies a particular square in the grid, e.g., based in part on personal level-and-frequency dependent audio filter 402 having personal average gain level 1702, and based in part on personal level-and-frequency dependent audio filter 402 having personal gain contour 1902. The selected filter having personal gain level 1702 and personal gain contour 1902 can be used by the process in a verification operation. At the verification operation, an audio signal, e.g., a music audio signal, can be output and played back by media system 100 using personal level-and-frequency dependent audio filter 402 that was identified during the enrollment process. The verification operation allows the user to adjust between the selected preset and normal play (no adjustment) so that the user can confirm that the adjustment is in fact an improvement. When the user agrees that the personal level-and-frequency dependent audio filter improves a listening experience, the user can select an element, e.g., "done," to complete the enrollment process.

At the conclusion of the enrollment process, personal level-and-frequency dependent audio filter 402 is identified as the audio filter having the preferred personal average gain level 1702 and personal gain contour 1902 of the user. Accordingly, at operation 1002, media system 100 can select personal level-and-frequency dependent audio filter 402 based in part on personal level-and-frequency dependent audio filter 402 having personal average gain level 1702, and based in part on personal level-and-frequency dependent audio filter 402 having personal gain contour 1902, as determined by the enrollment process.

The enrollment processes described above drives media system 100 toward the selection of personal level-and-frequency dependent audio filter 402 based on the assumption that the actual hearing loss of the user will be similar to the common hearing loss profile presets that are stored by the system. No knowledge of the user's personal audiogram 500 is necessary to complete the enrollment process. When personal audiogram 500 is available, however, it may lead to as good or better outcomes than the selection process described above.

Figure 21A:
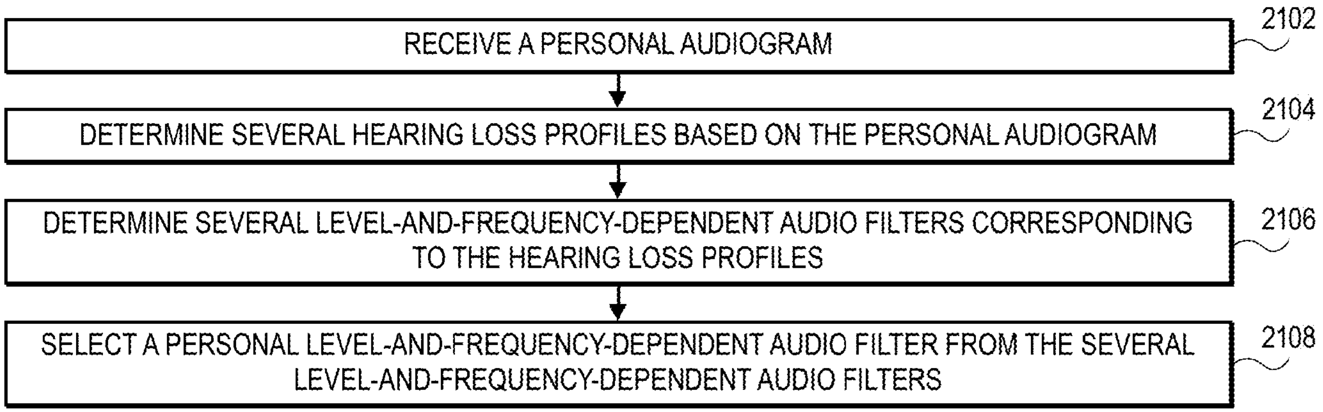
FIGS. 21A-21B are a flowchart and a pictorial view, respectively, of a method of determining several hearing loss profiles based on a personal audiogram, in accordance with an aspect.
Figure 21B:
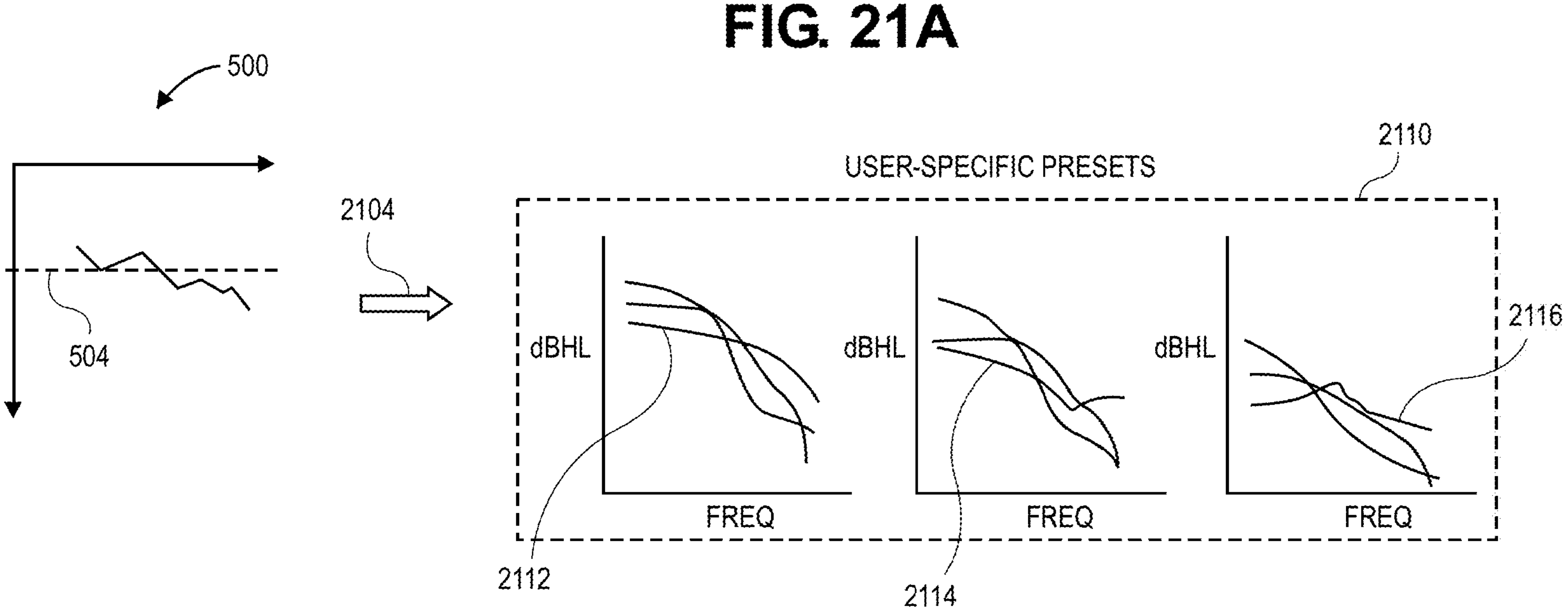

Referring to FIGS. 21A-21B, a flowchart and a pictorial view, respectively, of a method of determining several hearing loss profiles based on a personal audiogram are shown in accordance with an aspect. Personal audiogram 500 can be used to determine user-specific presets, as compared to the general presets that are stored for use in the enrollment process described above. For example, if personal audiogram 500 is known, media system 100 can select hearing loss profile presets and corresponding level-and-frequency-dependent audio filters that encompass the known audiogram. The determination of user-specific presets can constrain the range of level-and-frequency-dependent audio filters available for selection during the enrollment process, which can allow for greater granularity in the selection of the personal preset by the user.

In an aspect, the use of personal audiogram 500 to drive the presets available for selection during the enrollment process can be especially helpful for a user that has an uncommon hearing loss profile. Media system 100 can receive personal audiogram 500 at operation 2102. At operation 2104, media system 100 can determine several hearing loss profiles 2110 based on personal audiogram 500. Similarly, at operation 2106, media system 100 can determine level-and-frequency-dependent audio filters that correspond to the user-specific hearing loss profile presets. The determined hearing loss profiles and/or level-and-frequency-dependent audio filters can be user-specific presets that are personalized to the user to ensure a good listening experience. For example, an average hearing loss 504 of the user may be determined from personal audiogram 500, and the several user-specific presets that are determined may include hearing loss profiles that each have average hearing loss values similar to the average hearing loss value of personal audiogram 500. In an aspect, the average hearing loss values for each of the user-specific presets is within a predetermined difference, e.g., +/−10 dB hearing loss, of the average hearing loss value of personal audiogram 500. As shown in FIG. 21B, each of the user-specific presets can have hearing loss contours that differ, even though the average loss levels of the presets are similar. For example, one of the hearing loss profiles can have a flat loss contour 2112 that gradually diminishes with increasing frequency, one of the hearing loss profiles can have a flat loss contour 2114 that has an upward inflection point at around 4 kHz, and one of the hearing loss profiles can have a flat loss contour 2116 that has a downward inflection point at around 2 kHz. Such loss contours may be uncommon among the human population, however, media system 100 may use audio filters corresponding to the uncommon profiles during the enrollment process.

In an aspect, the determined level-and-frequency-dependent audio filters corresponding to the user-specific presets are applied to the speech and/or music audio signals. More particularly, the audio filters can be assessed in a decision tree such as the sequence described with respect to FIG. 20. Using the enrollment process, the user can identify one of the audio filters as personal level-and-frequency dependent audio filter 402 used to compensate for hearing loss of the user. Accordingly, at operation 2108, personal level-and-frequency dependent audio filter 402 is selected from the several level-and-frequency dependent audio filters 2110 for use at operation 1004 (FIG. 10).

Figure 22A:
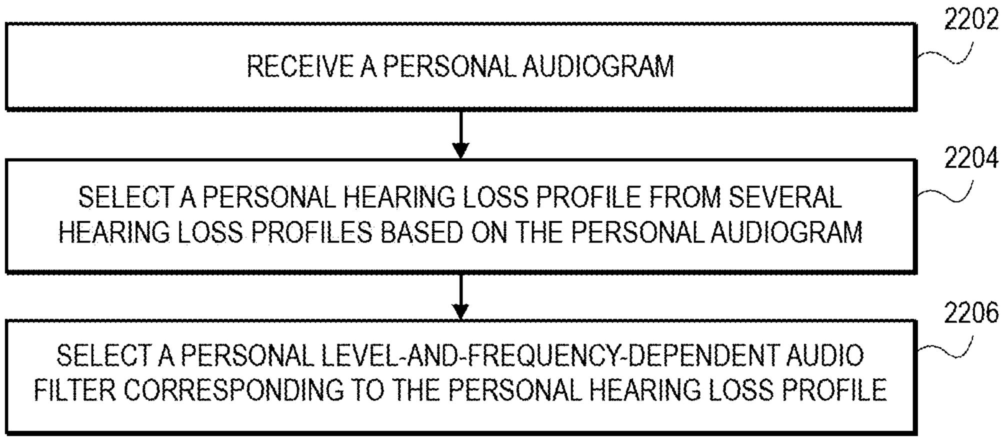
FIGS. 22A-22B are a flowchart and a pictorial view, respectively, of a method of determining a personal hearing loss profile based on a personal audiogram, in accordance with an aspect.
Figure 22B:
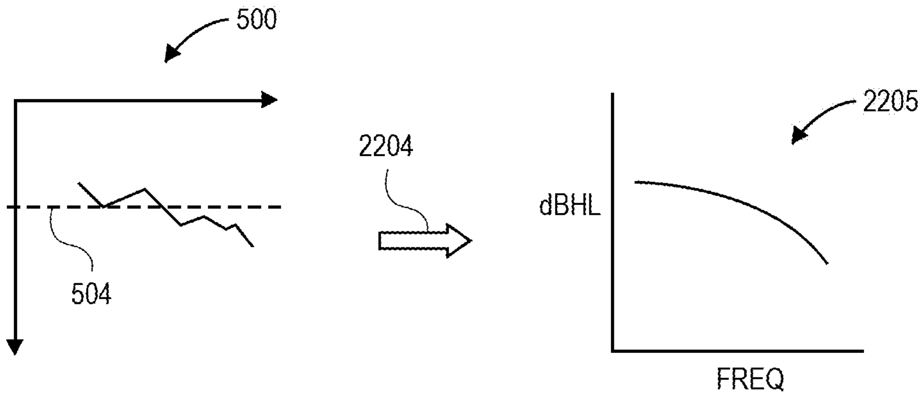

Referring to FIGS. 22A-22B, a flowchart and a pictorial view, respectively, of a method of determining a personal hearing loss profile based on a personal audiogram is shown in accordance with an aspect. Personal audiogram 500 can be used to select a particular hearing loss profile and a corresponding level-and-frequency-dependent audio filter from the range of presets stored and/or available to audio signal device 102. More particularly, personal audiogram 500 can be used to determine the preset that most closely corresponds to the known audiogram.

In an aspect, at operation 2202, media system 100 can receive personal audiogram 500. At operation 2204, media system 100 can determine and/or select a personal hearing loss profile 2205 based on personal audiogram 500. For example, personal hearing loss profile 2205 can be selected from several hearing loss profiles that are stored or available to media system 100. Selection of personal hearing loss profile 2205 may be driven by an algorithm for fitting personal audiogram 500 to the known hearing loss profiles. More particularly, media system 100 can select personal hearing loss profile 2205 having a same average hearing loss and hearing loss contour as personal audiogram 500. When the closest match is found, media system 100 can select personal hearing loss profile 2205 and determine the level-and-frequency-dependent audio filter that corresponds to personal hearing loss profile 2205. More particularly, at operation 2206, media system 100 can select or determine personal level-and-frequency dependent audio filter 402 corresponding to personal hearing loss profile 2205, which can be used to compensate for hearing loss of the user.

At operation 1004 (FIG. 10), personal level-and-frequency dependent audio filter 402 selected using one of the selection processes described above is applied to audio input signal 404. Application of personal level-and-frequency dependent audio filter 402 to audio input signal 404 can generate audio output signal 406. More particularly, personal level-and-frequency dependent audio filter 402 can amplify audio input signal 404 based on the input level 902 and the input frequency 904 of audio input signal 404. The amplification can boost audio input signal 404 in a manner that allows the user to perceive audio input signal 404 normally.

At operation 1006 (FIG. 10), audio output signal 406 is output by one or more processors of media system 100. Audio output signal 406 can be output for playback by output device. For example, audio signal device 102 can transmit audio output signal 406 to audio output device 104 through a wired or wireless connection. Audio output device 104 can receive audio output signal 406 and play audio content to the user. The reproduced audio can be audio from a phone call, music played by a personal media device, a voice of a virtual assistant, or any other audio content that is delivered by audio signal device 102 to audio output device 104.

Figure 23:
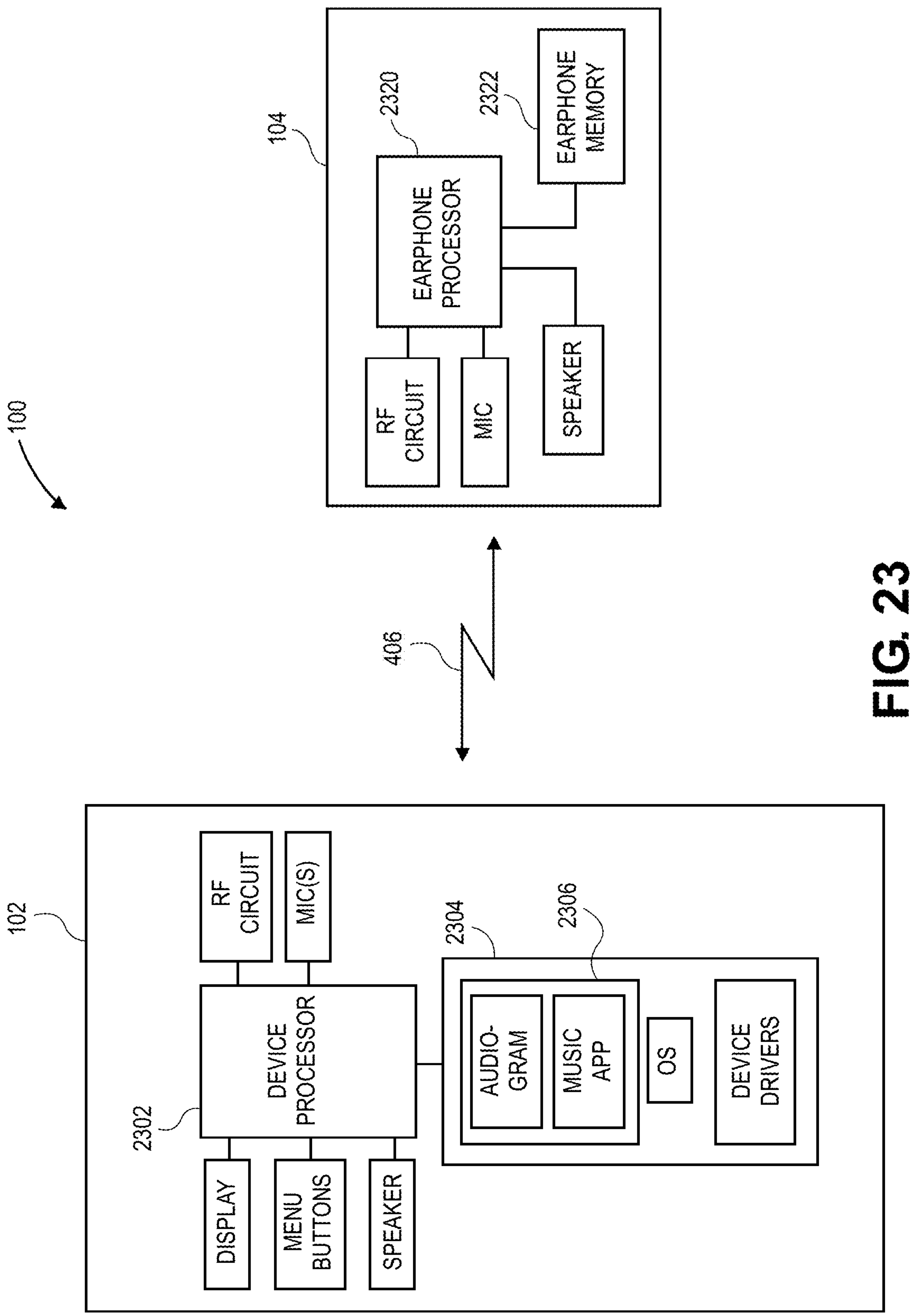
FIG. 23 is a block diagram of a media system, in accordance with an aspect.

Referring to FIG. 23, a block diagram of a media system is shown in accordance with an aspect. Audio signal device 102 may be any of several types of portable devices or apparatuses with circuitry suited to specific functionality. Accordingly, the diagrammed circuitry is provided by way of example and not limitation. Audio signal device 102 may include one or more device processors 2302 to execute instructions to carry out the different functions and capabilities described above. Instructions executed by device processor(s) 2302 of audio signal device 102 may be retrieved from a device memory 2304, which may include a non-transitory machine- or computer-readable medium. The instructions may be in the form of an operating system program having device drivers and/or an accessibility engine for performing the enrollment process and tuning audio input signal 404 based on personal level-and-frequency dependent audio filter 402 according to the methods described above. Device processor(s) 2302 may also retrieve audio data 2306 from device memory 2304, including audiograms or audio signals associated with phone and/or music playback functions controlled by the telephony or music application programs that run on top of the operating system. To perform such functions, device processor(s) 2302 may directly or indirectly implement control loops and receive input signals from and/or provide output signals to other electronic components. For example, audio signal device 102 may receive input signals from microphone(s), menu buttons, or physical switches. Audio signal device 102 can generate and output audio output signal 406 to a device speaker of audio signal device 102 (which may be an internal audio output device 104) and/or to an external audio output device 104. For example, audio output device 104 can be a corded or wireless earphone to receive audio output signal 406 via a wired or wireless communication link. More particularly, the processor(s) of audio signal device 102 and audio output device 104 may be connected to respective RF circuits to receive and process audio signals. For example, the communication link can be established by a wireless connection using a Bluetooth standard, and device processor 2302 can transmit audio output signal 406 wirelessly to audio output device 104 via the communication link. Wireless output device may receive and process audio output signal 406 to play audio content as sound, e.g., a phone call, podcast, music, etc. More particularly, audio output device 104 can receive and play back audio output signal 406 to play sound from an earphone speaker.

Audio output device 104 can include an earphone processor 2320 and an earphone memory 2322. Earphone processor 2320 and earphone memory 2322 can perform functions the functions performed by device processor 2302 and device memory 2304 described above. For example, audio signal device 102 can transmit one or more of audio input signal 404, hearing loss profiles, or level-and-frequency-dependent audio filters to earphone processor 2320, and audio output device 104 can use the input signals in an enrollment process and/or audio rendering process to generate audio output signal 406 using personal level-and-frequency dependent audio filter 402. More particularly, earphone processor 2320 may be configured to generate audio output signal 406 and present the signal for audio playback via the earphone speaker. Media system 100 may include several earphone components, although only a single earphone is shown in FIG. 23. Accordingly, a first audio output device 104 can be configured to present a left channel audio output and a second audio output device 104 can be configured to present a right channel audio output.

As described above, one aspect of the present technology is the gathering and use of data available from various sources to perform personalized media enhancement. The present disclosure contemplates that in some instances, this gathered data may include personal information data that uniquely identifies or can be used to contact or locate a specific person. Such personal information data can include demographic data, location-based data, telephone numbers, email addresses, TWITTER ID's, home addresses, data or records relating to a user's health or level of fitness (e.g., audiograms, vital signs measurements, medication information, exercise information), date of birth, or any other identifying or personal information.

The present disclosure recognizes that the use of such personal information data, in the present technology, can be used to the benefit of users. For example, the personal information data can be used to perform personalized media enhancement. Accordingly, use of such personal information data enables users to have an improved audio listening experience. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates aspects in which users selectively block the use of, or access to, personal information data. That is, the present disclosure contemplates that hardware and/or software elements can be provided to prevent or block access to such personal information data. For example, in the case of personalized media enhancement, the present technology can be configured to allow users to select to "opt in" or "opt out" of participation in the collection of personal information data during registration for services or anytime thereafter. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed aspects, the present disclosure also contemplates that the various aspects can also be implemented without the need for accessing such personal information data. That is, the various aspects of the present technology are not rendered inoperable due to the lack of all or a portion of such personal information data. For example, the enrollment process can be performed based on non-personal information data or a bare minimum amount of personal information, such as an approximate age of the user, other non-personal information available to the device processors, or publicly available information.

To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

In the foregoing specification, the invention has been described with reference to specific exemplary aspects thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method of enhancing an audio input signal to accommodate hearing loss, comprising:

outputting, by one or more processors of a media system, an audio signal using a plurality of audio filters, wherein the plurality of audio filters have respective gain contours corresponding to particular hearing loss profiles, wherein the plurality of audio filters includes two or more of a flat audio filter, a notched audio filter, or a sloped audio filter having the respective gain contours, wherein at a first frequency band a gain of a first audio filter of the plurality of audio filters is higher than a gain of a second audio filter of the plurality of audio filters, and wherein at a second frequency band the gain of the second audio filter is higher than the gain of the first audio filter;

receiving, by the one or more processors in response to outputting the audio signal using the plurality of audio filters, a selection of a personal gain contour corresponding to one of the particular hearing loss profiles;

selecting, by the one or more processors, a personal audio filter based in part on the personal audio filter having the personal gain contour; and generating, by the one or more processors, an audio output signal by applying the personal audio filter to the audio input signal, wherein the personal audio filter amplifies the audio input signal based on an input level and an input frequency of the audio input signal.

2. The method of claim 1, wherein the respective gain contours of the plurality of audio filters are different from each other.

3. The method of claim 2, wherein the audio signal represents music.

4. The method of claim 2, wherein the plurality of audio filters includes the flat audio filter, the notched audio filter, and the sloped audio filter, wherein at a low frequency band a gain of the flat audio filter is higher than gains of the notched audio filter and the sloped audio filter, wherein at an intermediate frequency band a gain of the notched audio filter is higher than gains of the flat audio filter and the sloped audio filter, and wherein at a high frequency band a gain of the sloped audio filter is higher than gains of the flat audio filter and the notched audio filter.

5. The method of claim 2 further comprising enabling, by the one or more processors, volume adjustment of the media system during output of the audio signal.

6. The method of claim 1 further comprising:

receiving, by the one or more processors, a personal audiogram;

determining, by the one or more processors, the particular hearing loss profiles based on the personal audiogram; and determining, by the one or more processors, the plurality of audio filters having respective gain contours corresponding to the particular hearing loss profiles.

7. The method of claim 1 further comprising:

receiving, by the one or more processors, a personal audiogram; and selecting a personal hearing loss profile from the particular hearing loss profiles based on the personal audiogram;

wherein the personal audio filter corresponds to the personal hearing loss profile.

8. The method of claim 1 further comprising transmitting the audio output signal to an audio output device for playback by the audio output device.

9. A media system, comprising:

a memory configured to store particular hearing loss profiles and a plurality of audio filters, wherein the plurality of audio filters have respective gain contours corresponding to the particular hearing loss profiles, wherein the plurality of audio filters includes two or more of a flat audio filter, a notched audio filter, or a sloped audio filter having the respective gain contours, wherein at a first frequency band a gain of a first audio filter of the plurality of audio filters is higher than a gain of a second audio filter of the plurality of audio filters, and wherein at a second frequency band the gain of the second audio filter is higher than the gain of the first audio filter; and one or more processors configured to:

output an audio signal using the plurality of audio filters;

receive, in response to outputting the audio signal using the plurality of audio filters, a selection of a personal gain contour corresponding to one of the particular hearing loss profiles;

select a personal audio filter based in part on the personal audio filter having the personal gain contour, and generate an audio output signal by applying the personal audio filter to an audio input signal, wherein the personal audio filter amplifies the audio input signal based on an input level and an input frequency of the audio input signal.

10. The media system of claim 9, wherein the respective gain contours of the plurality of audio filters are different from each other.

11. The media system of claim 10, wherein the audio signal represents music.

12. The media system of claim 10, wherein the plurality of audio filters includes the flat audio filter, the notched audio filter, and the sloped audio filter, wherein at a low frequency band a gain of the flat audio filter is higher than gains of the notched audio filter and the sloped audio filter, wherein at an intermediate frequency band a gain of the notched audio filter is higher than gains of the flat audio filter and the sloped audio filter, and wherein at a high frequency band a gain of the sloped audio filter is higher than gains of the flat audio filter and the notched audio filter.

13. The media system of claim 10, wherein the one or more processors are further configured to enable volume adjustment of the media system during output of the audio signal.

14. The media system of claim 9, wherein the one or more processors are further configured to:

receive a personal audiogram;

determine the particular hearing loss profiles based on the personal audiogram; and determine the plurality of audio filters having the respective gain contours corresponding to the particular hearing loss profiles.

15. The media system of claim 9, wherein the one or more processors are further configured to:

receive a personal audiogram; and select a personal hearing loss profile from the particular hearing loss profiles based on the personal audiogram;

wherein the personal audio filter corresponds to the personal hearing loss profile.

16. A non-transitory computer readable medium containing instructions, which when executed by one or more processors of a media system, cause the media system to perform a method comprising:

outputting, by the one or more processors, an audio signal using a plurality of audio filters, wherein the plurality of audio filters have respective gain contours corresponding to particular hearing loss profiles, wherein the plurality of audio filters includes two or more of a flat audio filter, a notched audio filter, or a sloped audio filter having the respective gain contours, wherein at a first frequency band a gain of a first audio filter of the plurality of audio filters is higher than a gain of a second audio filter of the plurality of audio filters, and wherein at a second frequency band the gain of the second audio filter is higher than the gain of the first audio filter;

receiving, by the one or more processors in response to outputting the audio signal using the plurality of audio filters, a selection of a personal gain contour corresponding to one of the particular hearing loss profiles;

selecting, by the one or more processors, a personal audio filter based in part on the personal audio filter having the personal gain contour; and generating, by the one or more processors, an audio output signal by applying the personal audio filter to an audio input signal, wherein the personal audio filter amplifies the audio input signal based on an input level and an input frequency of the audio input signal.

17. The non-transitory computer readable medium of claim 16, wherein the respective gain contours of the plurality of audio filters are different from each other.

18. The non-transitory computer readable medium of claim 17, wherein the plurality of audio filters includes the flat audio filter, the notched audio filter, and the sloped audio filter, wherein at a low frequency band a gain of the flat audio filter is higher than gains of the notched audio filter and the sloped audio filter, wherein at an intermediate frequency band a gain of the notched audio filter is higher than gains of the flat audio filter and the sloped audio filter, and wherein at a high frequency band a gain of the sloped audio filter is higher than gains of the flat audio filter and the notched audio filter.

19. The non-transitory computer readable medium of claim 16, the method further comprising:

receiving, by the one or more processors, a personal audiogram;

determining, by the one or more processors, the particular hearing loss profiles based on the personal audiogram; and determining, by the one or more processors, the plurality of audio filters having respective gain contours corresponding to the particular hearing loss profiles.

20. The non-transitory computer readable medium of claim 16, the method further comprising:

receiving, by the one or more processors, a personal audiogram; and selecting a personal hearing loss profile from the particular hearing loss profiles based on the personal audiogram;

wherein the personal audio filter corresponds to the personal hearing loss profile.

* * * * *